(12) United States Patent
Herner et al.

(10) Patent No.: US 11,844,217 B2
(45) Date of Patent: Dec. 12, 2023

(54) METHODS FOR FORMING MULTI-LAYER VERTICAL NOR-TYPE MEMORY STRING ARRAYS

(71) Applicant: SUNRISE MEMORY CORPORATION, San Jose, CA (US)

(72) Inventors: Scott Brad Herner, Portland, OR (US); Wu-Yi Henry Chien, San Jose, CA (US); Jie Zhou, San Jose, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 94 days.

(21) Appl. No.: 17/669,024

(22) Filed: Feb. 10, 2022

(65) Prior Publication Data

US 2022/0165751 A1    May 26, 2022

Related U.S. Application Data

(62) Division of application No. 16/707,920, filed on Dec. 9, 2019, now Pat. No. 11,282,855.

(60) Provisional application No. 62/777,000, filed on Dec. 7, 2018.

(51) Int. Cl.
*H10B 43/27*     (2023.01)
*H01L 21/3213*   (2006.01)
*H01L 21/311*    (2006.01)

(52) U.S. Cl.
CPC ........ *H10B 43/27* (2023.02); *H01L 21/31144* (2013.01); *H01L 21/32139* (2013.01); *H01L 21/31116* (2013.01)

(58) Field of Classification Search
CPC ......... H01L 21/31144; H01L 21/32139; H01L 21/31116
See application file for complete search history.

(56) References Cited

U.S. PATENT DOCUMENTS

| | | |
|---|---|---|
| 4,213,139 A | 7/1980 | Rao |
| 5,583,808 A | 12/1996 | Brahmbhatt |
| 5,646,886 A | 7/1997 | Brahmbhatt |
| 5,656,842 A | 8/1997 | Iwamatsu |
| 5,768,192 A | 6/1998 | Eitan |
| 5,789,776 A | 8/1998 | Lancaster et al. |

(Continued)

FOREIGN PATENT DOCUMENTS

| | | |
|---|---|---|
| JP | 2000-243972 A2 | 9/2000 |
| JP | 2010251572 A | 11/2010 |

(Continued)

OTHER PUBLICATIONS

"EP Extended Search Report EP168690149.3", dated Oct. 18, 2019.

(Continued)

*Primary Examiner* — Christine A Enad
(74) *Attorney, Agent, or Firm* — Edward C. Kwok; VLP Law Group LLP

(57) ABSTRACT

A method for forming 3-dimensional vertical NOR-type memory string arrays uses damascene local bit lines is provided. The method of the present invention also avoids ribboning by etching local word lines in two steps. By etching the local word lines in two steps, the aspect ratio in the patterning and etching of stack of local word lines ("word line stacks") is reduced, which improves the structural stability of the word line stacks.

21 Claims, 29 Drawing Sheets

(56) References Cited

U.S. PATENT DOCUMENTS

| | | |
|---|---|---|
| 5,880,993 A | 3/1999 | Kramer et al. |
| 5,915,167 A | 6/1999 | Leedy |
| 6,040,605 A | 3/2000 | Sano et al. |
| 6,107,133 A | 8/2000 | Furukawa et al. |
| 6,118,171 A | 9/2000 | Davies et al. |
| 6,130,838 A | 10/2000 | Kim et al. |
| 6,434,053 B1 | 8/2002 | Fujiwara |
| 6,580,124 B1 | 6/2003 | Cleeves et al. |
| 6,744,094 B2 | 6/2004 | Forbes |
| 6,774,458 B2 | 8/2004 | Fricke et al. |
| 6,873,004 B1 | 3/2005 | Han et al. |
| 6,881,994 B2 | 4/2005 | Lee et al. |
| 6,946,703 B2 | 9/2005 | Ryu et al. |
| 7,005,350 B2 | 2/2006 | Walker et al. |
| 7,307,308 B2 | 12/2007 | Lee |
| 7,489,002 B2 | 2/2009 | Forbes et al. |
| 7,524,725 B2 | 4/2009 | Chung |
| 7,542,348 B1 | 6/2009 | Kim |
| 7,612,411 B2 | 11/2009 | Walker |
| 7,804,145 B2 | 9/2010 | Shimizu et al. |
| 8,026,521 B1 | 9/2011 | Or-Bach et al. |
| 8,139,418 B2 | 3/2012 | Carman |
| 8,178,396 B2 | 5/2012 | Sinha et al. |
| 8,395,942 B2 | 3/2013 | Samachisa et al. |
| 8,542,513 B2 | 9/2013 | Tang et al. |
| 8,604,618 B2 | 12/2013 | Cooney et al. |
| 8,630,114 B2 | 1/2014 | Lue |
| 8,767,473 B2 | 7/2014 | Shim et al. |
| 8,848,425 B2 | 9/2014 | Schloss |
| 8,878,278 B2 | 11/2014 | Alsmeier et al. |
| 9,076,879 B2 | 7/2015 | Yoo et al. |
| 9,105,310 B2 | 8/2015 | Li et al. |
| 9,190,293 B2 | 11/2015 | Wang et al. |
| 9,202,694 B2 | 12/2015 | Konevecki et al. |
| 9,230,985 B1 | 1/2016 | Wu et al. |
| 9,299,580 B2 | 3/2016 | Kong et al. |
| 9,412,752 B1 | 8/2016 | Yeh et al. |
| 9,455,268 B2 | 9/2016 | Oh et al. |
| 9,620,605 B2 | 4/2017 | Liang et al. |
| 9,633,944 B2 | 4/2017 | Kim |
| 9,748,172 B2 | 8/2017 | Takaki |
| 9,799,761 B2 | 10/2017 | Or-Bach et al. |
| 9,842,651 B2 | 12/2017 | Harari |
| 9,892,800 B2 | 2/2018 | Harari |
| 9,911,497 B1 | 3/2018 | Harari |
| 10,074,667 B1 | 9/2018 | Higashi |
| 10,096,364 B2 | 10/2018 | Harari |
| 10,121,553 B2 | 11/2018 | Harari |
| 10,217,667 B2 | 2/2019 | Or-Bach et al. |
| 10,249,370 B2 | 4/2019 | Harari |
| 10,254,968 B1 | 4/2019 | Gazit et al. |
| 10,283,493 B1 | 5/2019 | Nishida |
| 10,373,956 B2 | 8/2019 | Gupta et al. |
| 10,381,370 B2 | 8/2019 | Shin et al. |
| 10,381,378 B1 | 8/2019 | Harari |
| 10,395,737 B2 | 8/2019 | Harari |
| 10,431,596 B2 | 10/2019 | Herner et al. |
| 10,475,812 B2 | 11/2019 | Harari |
| 10,622,377 B2 | 4/2020 | Harari et al. |
| 10,651,196 B1 * | 5/2020 | Sharangpani ..... H01L 21/76879 |
| 10,692,874 B2 | 6/2020 | Harari et al. |
| 11,049,879 B2 | 6/2021 | Harari et al. |
| 2001/0030340 A1 | 10/2001 | Fujiwara |
| 2001/0053092 A1 | 12/2001 | Kosaka et al. |
| 2002/0012271 A1 | 1/2002 | Forbes |
| 2002/0028541 A1 | 3/2002 | Lee et al. |
| 2002/0051378 A1 | 5/2002 | Ohsawa |
| 2002/0193484 A1 | 12/2002 | Albee |
| 2003/0038318 A1 | 2/2003 | Forbes |
| 2004/0214387 A1 | 10/2004 | Madurawe et al. |
| 2004/0246807 A1 | 12/2004 | Lee |
| 2004/0262681 A1 | 12/2004 | Masuoka et al. |
| 2004/0262772 A1 | 12/2004 | Ramanathan et al. |
| 2004/0264247 A1 | 12/2004 | Kim |
| 2005/0128815 A1 | 6/2005 | Ishikawa et al. |
| 2005/0280061 A1 | 12/2005 | Lee |
| 2006/0001083 A1 | 1/2006 | Bhattacharyya |
| 2006/0155921 A1 | 7/2006 | Gorobets et al. |
| 2007/0012987 A1 | 1/2007 | McTeer |
| 2007/0045711 A1 | 3/2007 | Bhattacharyya |
| 2007/0134876 A1 | 6/2007 | Lai et al. |
| 2008/0178794 A1 | 7/2008 | Cho et al. |
| 2008/0239812 A1 | 10/2008 | Naofumi et al. |
| 2008/0301359 A1 | 12/2008 | Smith |
| 2009/0057722 A1 | 3/2009 | Masuoka et al. |
| 2009/0157946 A1 | 6/2009 | Arya |
| 2009/0237996 A1 | 9/2009 | Kirsch et al. |
| 2009/0279360 A1 | 11/2009 | Peter et al. |
| 2009/0316487 A1 | 12/2009 | Lee et al. |
| 2010/0124116 A1 | 5/2010 | Takashi et al. |
| 2010/0128509 A1 | 5/2010 | Kim et al. |
| 2010/0327413 A1 * | 12/2010 | Lee .................. H01L 21/31144 |
| | | 156/345.24 |
| 2011/0044113 A1 | 2/2011 | Kim |
| 2011/0115011 A1 | 5/2011 | Masuoka et al. |
| 2011/0134705 A1 | 6/2011 | Jones et al. |
| 2011/0208905 A1 | 8/2011 | Shaeffer et al. |
| 2011/0298013 A1 | 12/2011 | Hwang et al. |
| 2012/0028347 A1 | 2/2012 | Takekoshi et al. |
| 2012/0182801 A1 | 7/2012 | Lue |
| 2012/0208347 A1 * | 8/2012 | Hwang ................ H01L 21/762 |
| | | 257/E21.546 |
| 2012/0243314 A1 | 9/2012 | Takashi |
| 2012/0307568 A1 | 12/2012 | Banna et al. |
| 2013/0256780 A1 | 10/2013 | Kai et al. |
| 2014/0015036 A1 | 1/2014 | Fursin et al. |
| 2014/0040698 A1 | 2/2014 | Loh et al. |
| 2014/0075135 A1 | 3/2014 | Choi et al. |
| 2014/0112075 A1 | 4/2014 | Dunga et al. |
| 2014/0117366 A1 | 5/2014 | Saitoh |
| 2014/0151774 A1 | 6/2014 | Rhie |
| 2014/0229131 A1 | 8/2014 | Cohen et al. |
| 2014/0247674 A1 | 9/2014 | Karda et al. |
| 2014/0264546 A1 | 9/2014 | Lai et al. |
| 2014/0328128 A1 | 11/2014 | Louie et al. |
| 2014/0340952 A1 | 11/2014 | Ramaswamy et al. |
| 2015/0054507 A1 | 2/2015 | Gulaka et al. |
| 2015/0098272 A1 | 4/2015 | Kasolra et al. |
| 2015/0155876 A1 | 6/2015 | Jayasena et al. |
| 2015/0194440 A1 | 7/2015 | Noh et al. |
| 2015/0214239 A1 | 7/2015 | Rhie |
| 2015/0249143 A1 | 9/2015 | Sano |
| 2015/0263010 A1 | 9/2015 | Chuang et al. |
| 2015/0372099 A1 | 12/2015 | Chen et al. |
| 2016/0013156 A1 | 1/2016 | Zhai et al. |
| 2016/0019951 A1 | 1/2016 | Park et al. |
| 2016/0056050 A1 | 2/2016 | Kong et al. |
| 2016/0056210 A1 | 2/2016 | Takaki |
| 2016/0086970 A1 | 3/2016 | Peng |
| 2016/0225860 A1 | 8/2016 | Karda et al. |
| 2016/0300724 A1 | 10/2016 | Levy et al. |
| 2016/0314042 A1 | 10/2016 | Plants |
| 2016/0358934 A1 | 12/2016 | Lin et al. |
| 2017/0092370 A1 | 3/2017 | Harari |
| 2017/0092371 A1 | 3/2017 | Harari |
| 2017/0148517 A1 | 5/2017 | Harari |
| 2017/0148810 A1 | 5/2017 | Kai et al. |
| 2017/0194341 A1 * | 7/2017 | Yamada ............ H01L 21/32139 |
| 2017/0213731 A1 | 7/2017 | Yoon et al. |
| 2017/0301687 A1 * | 10/2017 | Takahashi ............... H10B 43/35 |
| 2017/0358594 A1 | 12/2017 | Lu et al. |
| 2018/0019256 A1 | 1/2018 | Amano et al. |
| 2018/0095127 A1 | 4/2018 | Pappu et al. |
| 2018/0108416 A1 | 4/2018 | Harari |
| 2018/0269229 A1 | 9/2018 | Or-Bach et al. |
| 2018/0315758 A1 | 11/2018 | Yoo et al. |
| 2018/0331042 A1 | 11/2018 | Manusharow et al. |
| 2018/0366471 A1 | 12/2018 | Harari et al. |
| 2018/0366485 A1 | 12/2018 | Harari |
| 2018/0366489 A1 | 12/2018 | Harari et al. |
| 2019/0006009 A1 | 1/2019 | Harari |
| 2019/0019564 A1 | 1/2019 | Li et al. |
| 2019/0067327 A1 | 2/2019 | Herner et al. |
| 2019/0157296 A1 | 5/2019 | Harari et al. |

(56) References Cited

U.S. PATENT DOCUMENTS

| | | |
|---|---|---|
| 2019/0180821 A1 | 6/2019 | Harari |
| 2019/0206890 A1 | 7/2019 | Harari et al. |
| 2019/0244971 A1 | 8/2019 | Harari |
| 2019/0259769 A1 | 8/2019 | Karda et al. |
| 2019/0303042 A1 | 10/2019 | Kim et al. |
| 2019/0325964 A1 | 10/2019 | Harari |
| 2019/0319044 A1 | 11/2019 | Harari |
| 2019/0348424 A1 | 11/2019 | Karda et al. |
| 2019/0355747 A1 | 11/2019 | Herner et al. |
| 2019/0370117 A1 | 12/2019 | Fruchtman et al. |
| 2020/0051990 A1 | 2/2020 | Harari et al. |
| 2020/0098738 A1 | 3/2020 | Herner et al. |
| 2020/0098779 A1 | 3/2020 | Cernea et al. |
| 2020/0176468 A1 | 6/2020 | Herner et al. |
| 2020/0258897 A1 | 8/2020 | Yan et al. |

FOREIGN PATENT DOCUMENTS

| | | |
|---|---|---|
| KR | 20120085591 A1 | 8/2012 |
| KR | 20120085603 A | 8/2012 |
| KR | 20120085945 A1 | 8/2012 |
| WO | 2018236937 A1 | 12/2018 |

OTHER PUBLICATIONS

"European Search Report, EP 16852238.1", dated Mar. 28, 2019.
"European Search Report, EP17844550.8", dated Aug. 12, 2020, 11 pages.
"Invitation to Pay Additional Fees (PCT/ISA/206), PCT/US2020/015710", dated Mar. 20, 2020, 2 pages.
"Invitation to Pay Additional Fees, PCT/US2019/065256", dated Feb. 13, 2020, 2 pages.
"Notification of Reasons for Refusal, Japanese Patent Application 2018-527740", (English translation), dated Nov. 4, 2020, 8 pages.
"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2019/014319", dated Apr. 15, 2019.
"PCT Search Report and Written Opinion, PCT/US2019/052164", dated Feb. 27, 2020.
"PCT Search Report and Written Opinion, PCT/US2019/052446", dated Dec. 11, 2019.
"PCT Search Report and Written Opinion, PCT/US2019/065256", dated Apr. 14, 2020.
"PCT Search Report and Written Opinion, PCT/US2020/015710", dated Jun. 9, 2020.
"PCT Search Report and Written Opinion, PCT/US2020/017494", dated Jul. 20, 2020, 13 pages.
"PCT Search Report and Written Opinion, PCT/US2021/016964", dated Jun. 15, 2021, 19 pages.
"PCT Search Report and Written Opinion, PCT/US2021/025722", dated Jun. 15, 2021, 10 pages.
Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.
Kim, N. , et al., "Multi-layered Vertical gate NANO Flash Overcoming Stacking Limit for Terabit Density Storage", Symposium on VLSI Tech. Dig. of Technical Papers, 2009, pp. 188-189.
Lue, H.T. , et al., "A Highly Scalable 8- Layer 3D Vertical-gate {VG} TFT Nano Flash Using Junction-Free Buried Channel BE-SONOS Device", Symposium on VLSI: Tech. Dig. of Technical Papers, 2010, pp. 131-132.
Tanaka, T. , et al., "A 768 GB 3b/cell 3D-Floaling-Gate NANO Flash Memory", Digest of Technical Papers, the 2016 IEEE International Solid-Slate Circuits Conference, 2016, pp. 142-144.
Wann, H.C. , et al., "High-Endurance Ultra-Thin Tunnel Oxide in Monos Device Structure for Dynamic Memory Application", IEEE Electron Device letters, vol. 16, No. 11, Nov. 1995, pp. 491-493.

\* cited by examiner

METHODS FOR FORMING MULTI-LAYER VERTICAL NOR-TYPE MEMORY STRING ARRAYS

CROSS REFERENCE TO RELATED APPLICATIONS

The present application is a divisional application of U.S. patent application ("Parent Application"), Ser. No. 16/707,920, entitled "Methods for Forming Multi-layer Vertical NOR-type Memory String Arrays," filed on Dec. 9, 2019, which claims priority of U.S. provisional application ("Provisional Application"), Ser. No. 62/777,000, entitled "Methods for Forming Multi-layer Vertical NOR-type Memory String Arrays," filed Dec. 7, 2018.

The present application relates to U.S. patent application ("Non-Provisional Application I"), Ser. No. 16/107,732, "entitled "Three-dimensional vertical NOR Flash Thin film Transistor Strings," Aug. 21, 2018, which is a continuation application of U.S. patent application Ser. No. 15/837,734, entitled "Three-dimensional vertical NOR Flash Thin film Transistor Strings," filed on Dec. 11, 2017, which is a divisional application of U.S. patent application Ser. No. 15/343,332, entitled "Three-dimensional vertical NOR Flash Thin film Transistor Strings," filed on Nov. 4, 2016, which is related to and claims priority of (i) U.S. provisional patent application Ser. No. 62/260,137, entitled "Three-dimensional Vertical NOR Flash Thin-film Transistor Strings," filed on Nov. 25, 2015.

The present application is also related to U.S. provisional patent application ("Provisional Application II"), Ser. No. 62/625,818, entitled "Three-dimensional Vertical NOR Flash Thin-film Transistor Strings," filed on Feb. 2, 2018; (ii) U.S. patent application ("Provisional Application III"), Ser. No. 62/630,214, entitled "Three-dimensional Vertical NOR Flash Thin-film Transistor Strings," filed on Feb. 13, 2018; and (iii) U.S. provisional patent application ("Provisional Application IV"), Ser. No. 62/771,922, entitled "Staircase Structures for Electrically Connecting Multiple Horizontal Conductive Layers of a 3-Dimensional Memory Device," filed on Nov. 27, 2018.

The disclosures of the Parent Application, the Non-Provisional Application and Provisional Applications I, II, III and IV are hereby incorporated by reference in their entireties.

BACKGROUND OF THE INVENTION

1. Field of the Invention

The present invention is related to 3-dimensional memory structures. In particular, the present invention is related to 3-dimensional memory structures organized in arrays of vertical NOR-type memory strings.

2. Discussion of the Related Art

Methods for forming multi-layer Vertical NOR-type memory string arrays have been described previously; for example, various variations of forming such memory arrays are disclosed in Non-Provisional Application and Provisional Applications II and III incorporated by reference above.

SUMMARY

According to one embodiment of the present invention, a method for forming 3-dimensional vertical NOR-type memory string arrays uses damascene local vertical bit lines is provided. The method of the present invention also avoids ribboning by etching local word lines in two steps. By etching the local word lines in two steps, the aspect ratio in the patterning and etching of stacks of local word lines ("word line stacks") is reduced, which improves the structural stability of the word line stacks. The present invention also addresses alignment issues incidental to etching the word line strips in two steps.

The present invention is better understood upon consideration of the detailed description below in conjunction with the accompanying drawings.

Figure 1:
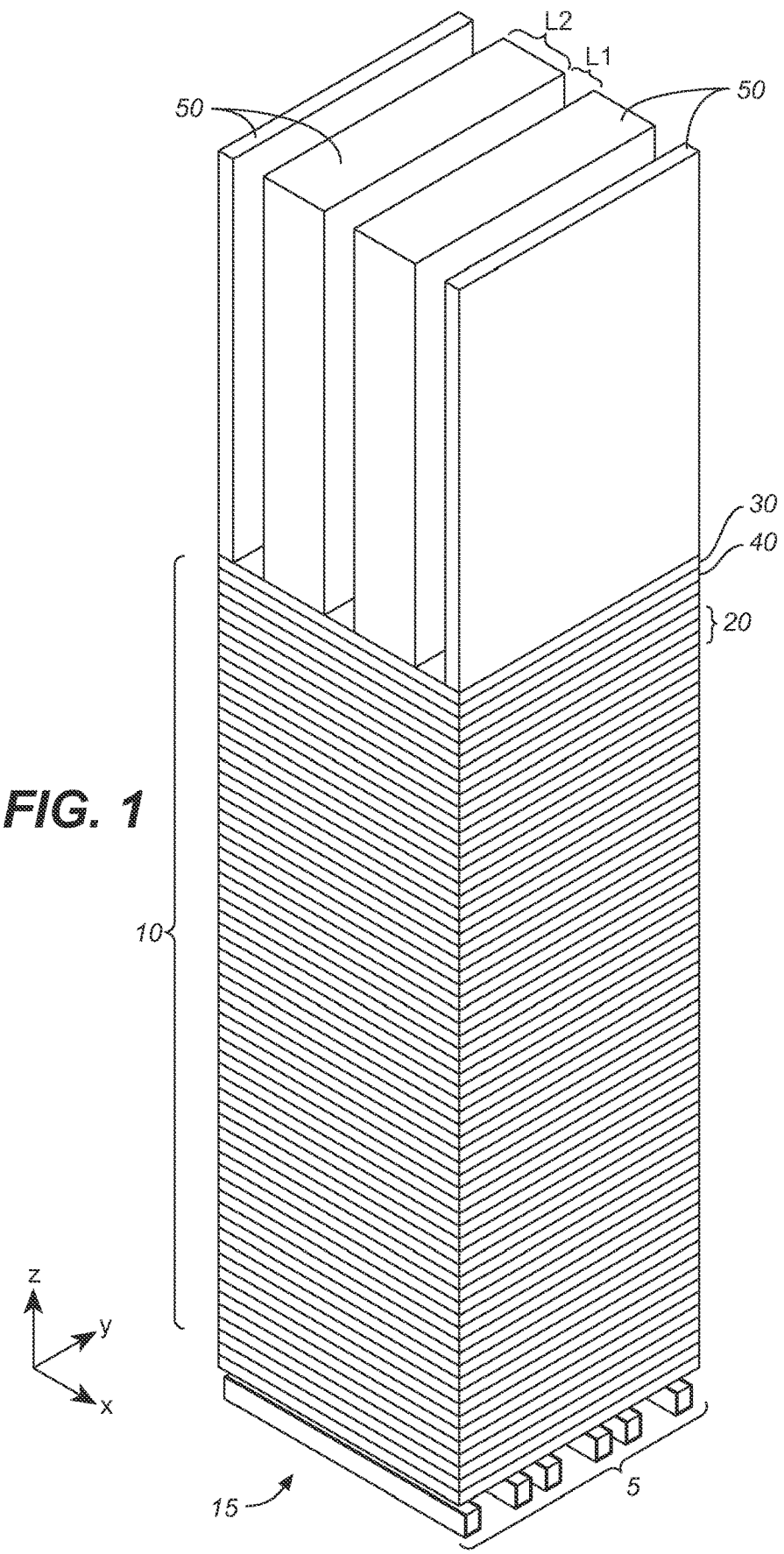
FIG. 1 shows memory structure 10 provided on and isolated from a conductive layer ("global interconnect lines") 5, which includes numerous conductors, each extending along a first direction (X-direction).

vias 120: (i) tunneling dielectric layer 130, (ii) charge storage layer 140, (iii) blocking dielectric layer 150, (iv) channel layer 160, (v) liner layer 170, and (vi) sacrificial dielectric layer 180.

Figure 8:
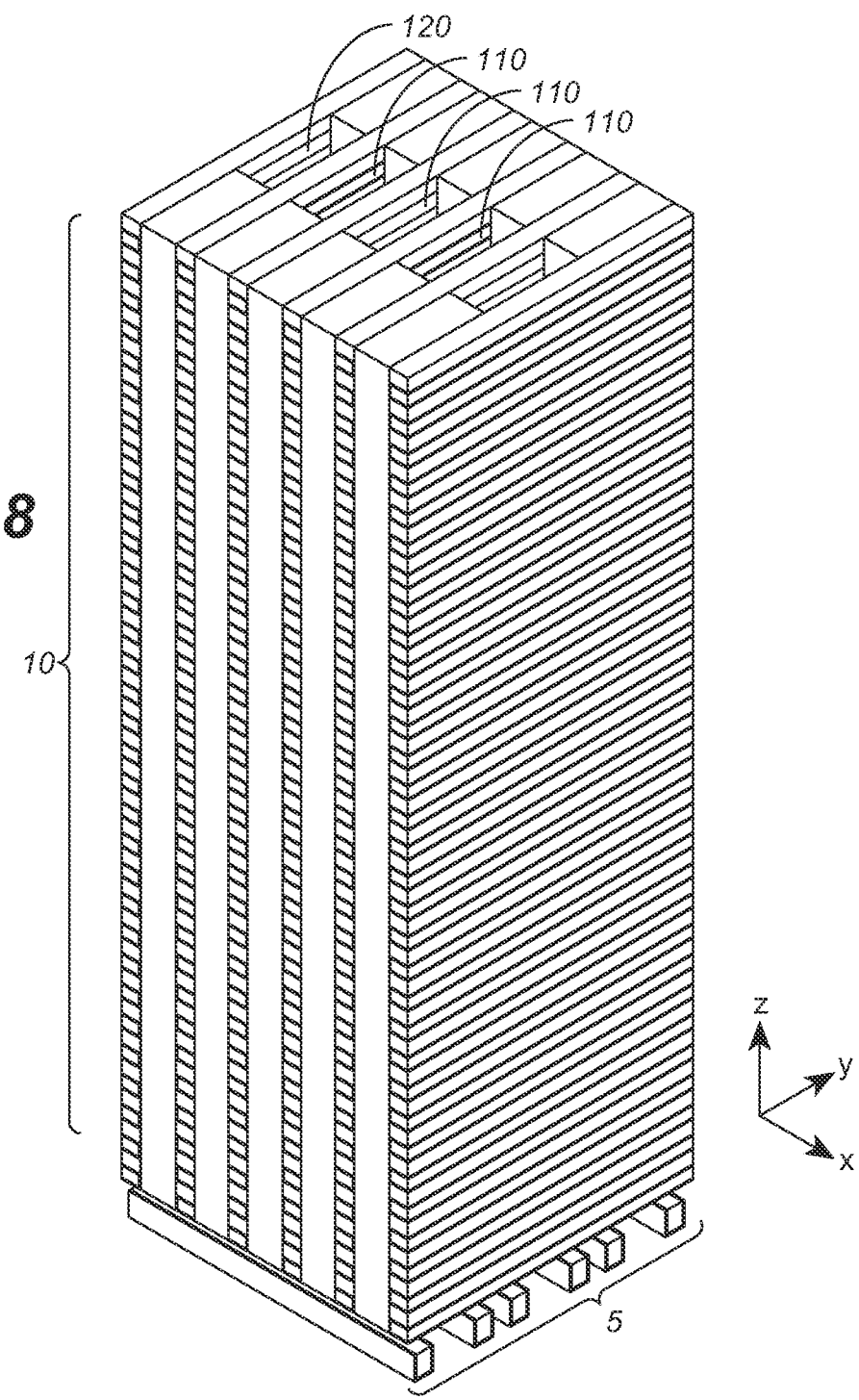
FIG. 8 shows patterning and etching of vias 120 in trenches 55 and 80 through memory structure 10.
Figure 9:
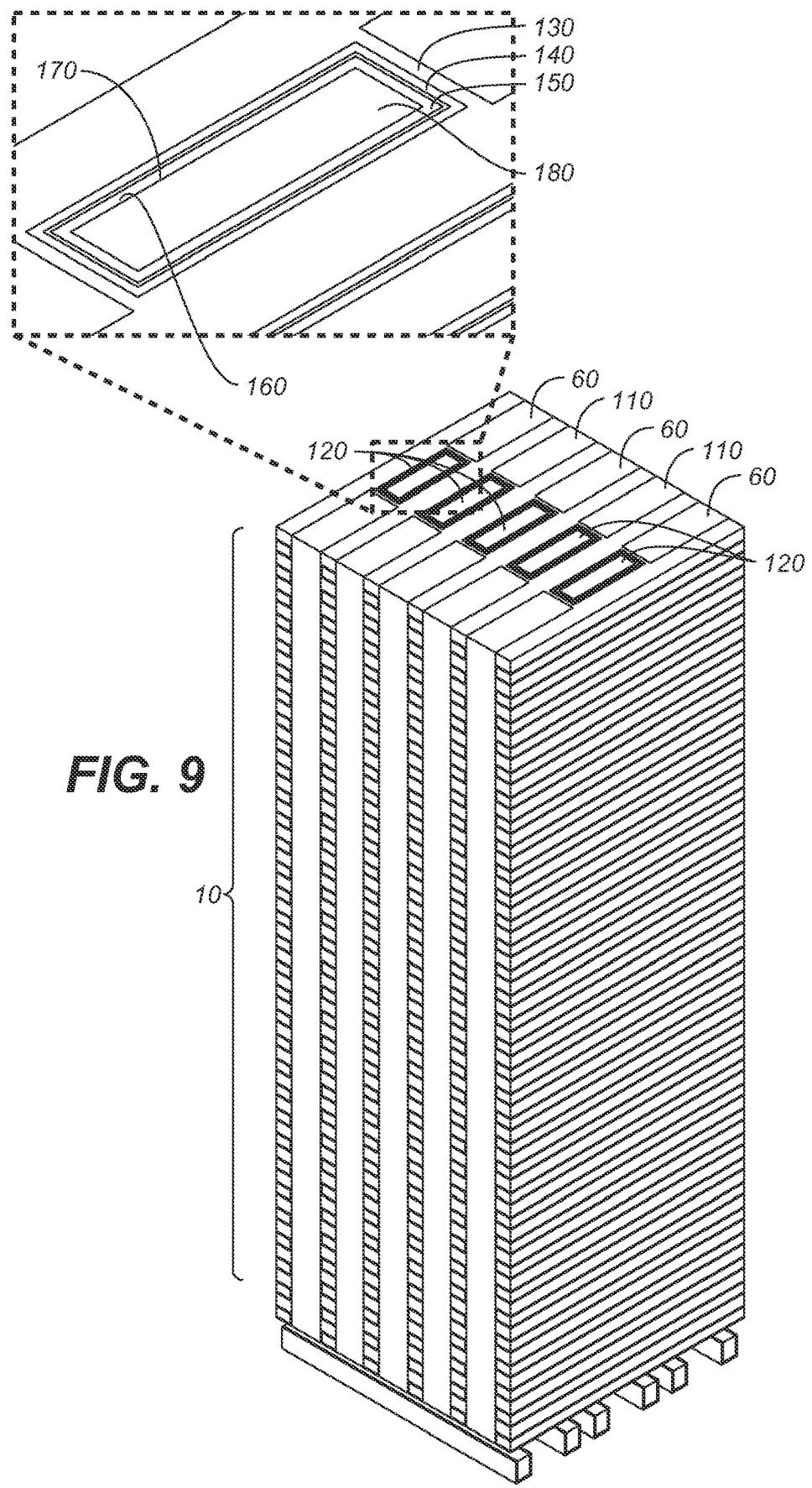
FIG. 9 shows deposition of the following layers conformally in vias 120 of FIG. 8.
Figure 10:
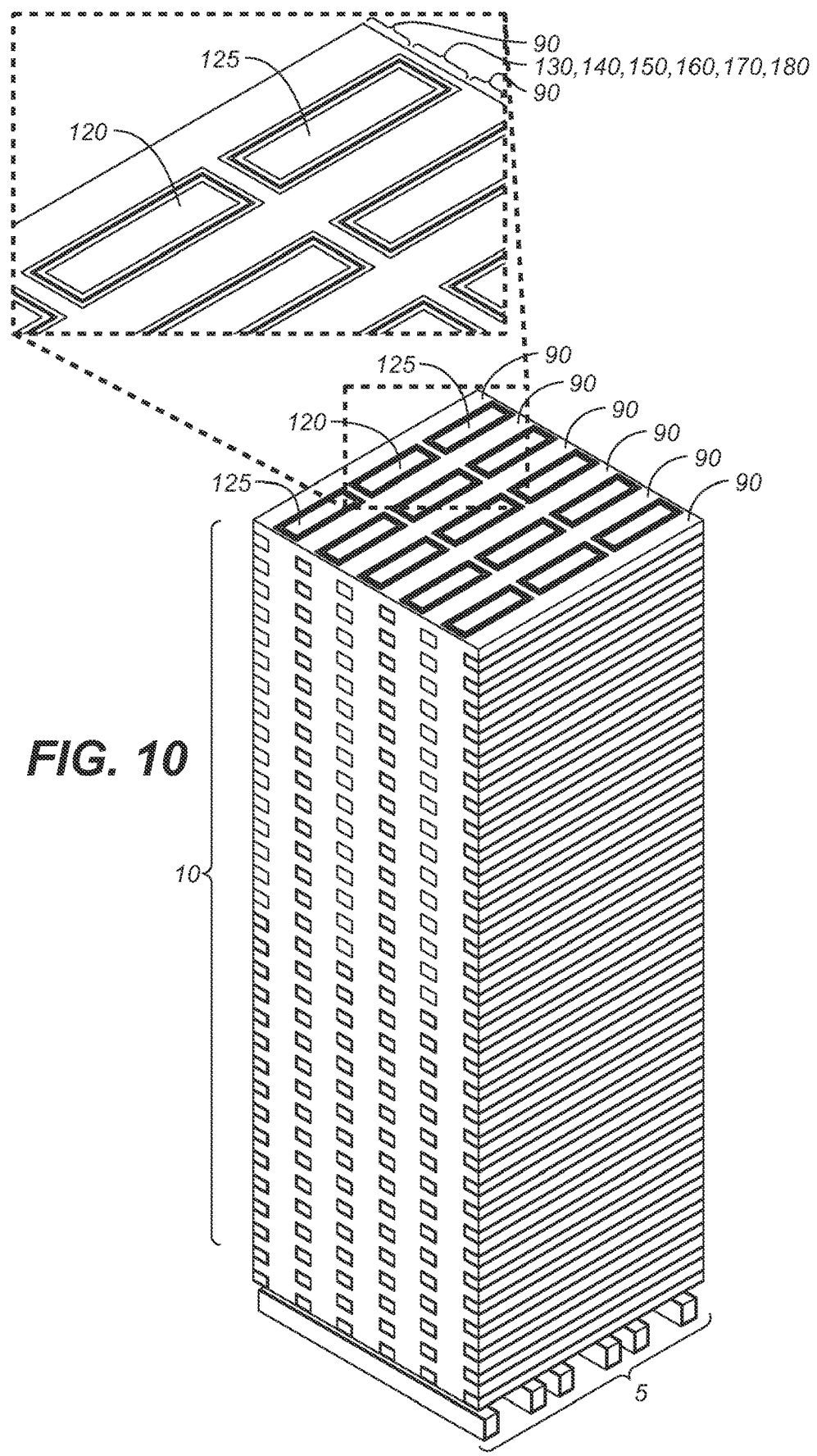

FIG. 10 shows the resulting memory structure 10 after the steps of creating vias of FIG. 8 and the deposition of various layers of FIG. 9 are repeated.

Figure 11:
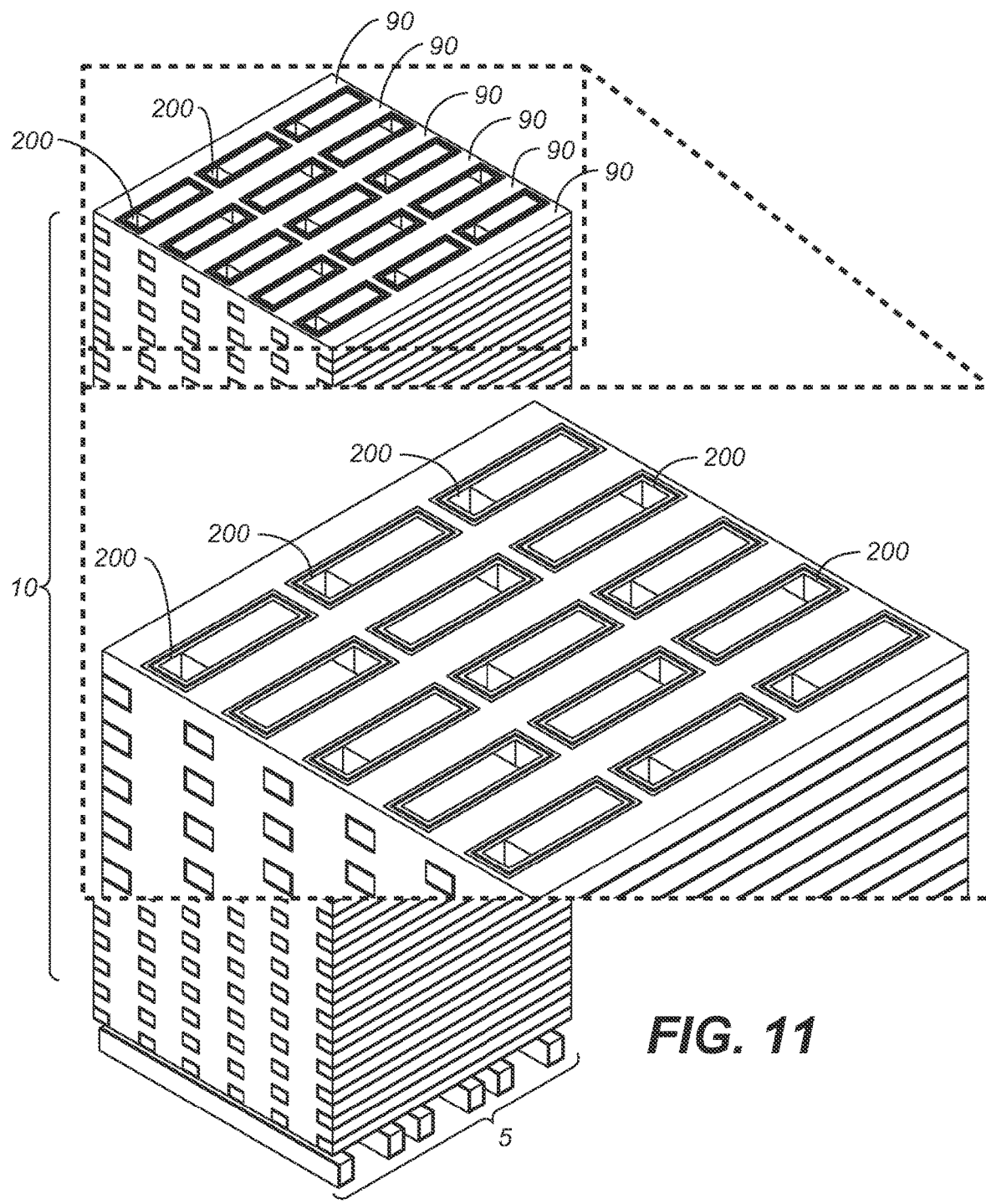

FIG. 11 shows shafts 200 defined in sacrificial dielectric layer 180 using photolithography and etched.

Figure 12:
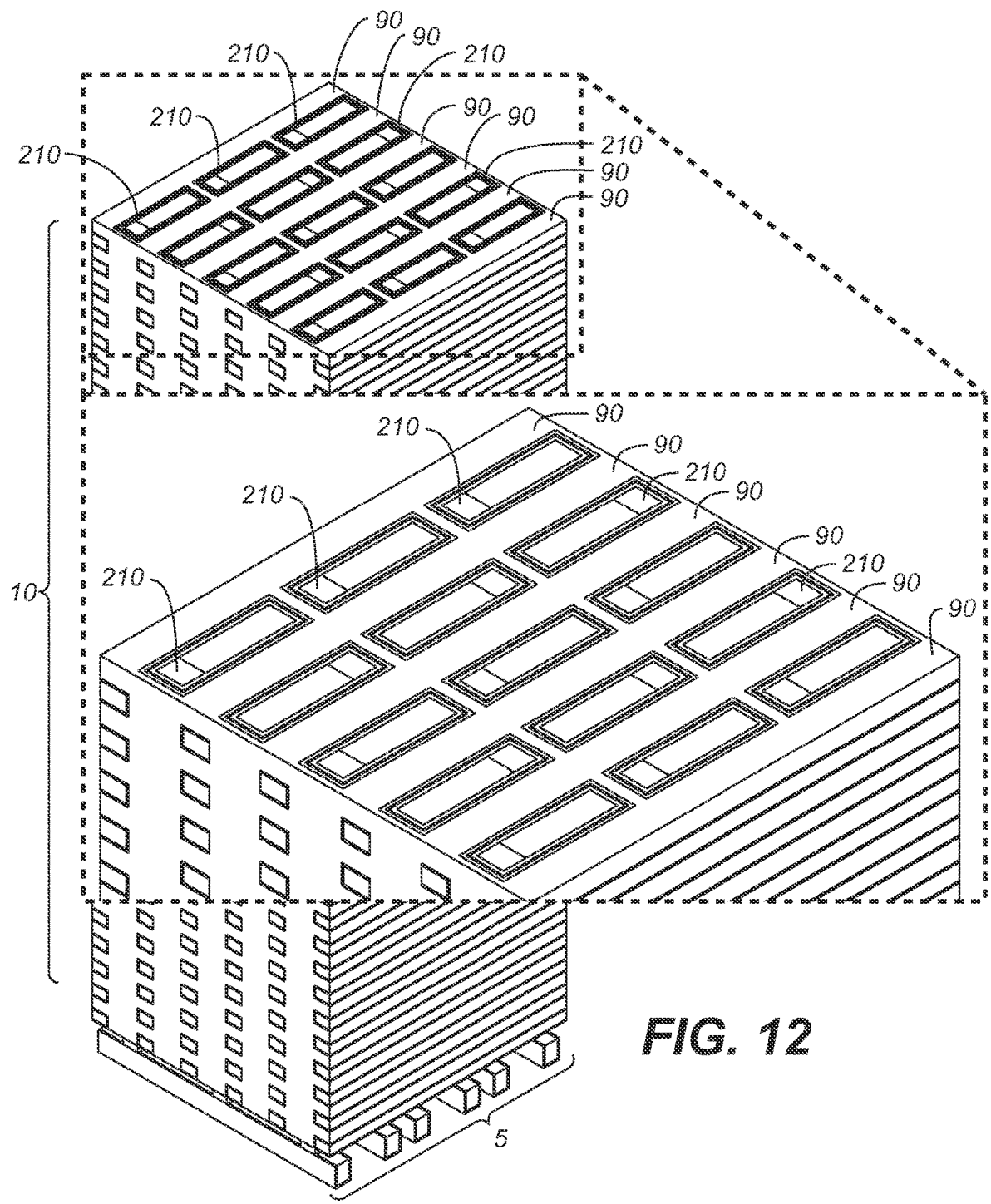

FIG. 12 shows each of shafts 200 being filled with semiconductor material 210, which form a common source region for the thin-film transistors to be formed along that via.

Figure 13:
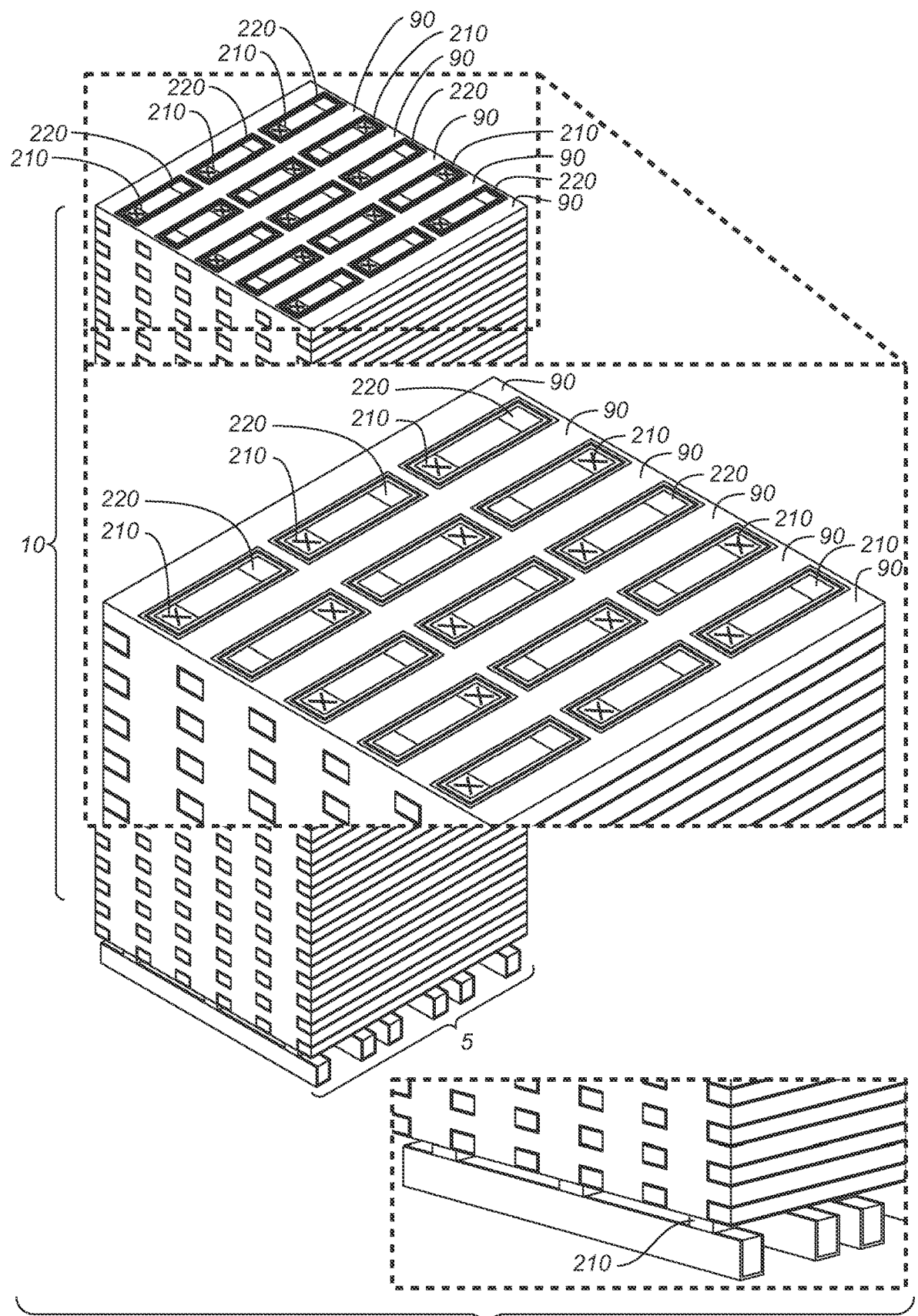

FIG. 13 shows drain semiconductor layers 220 being provided by repeating the steps of defining vias, etching liner layer 170 and filling vias with a semiconductor layer of FIGS. 11-12.

Figure 14:
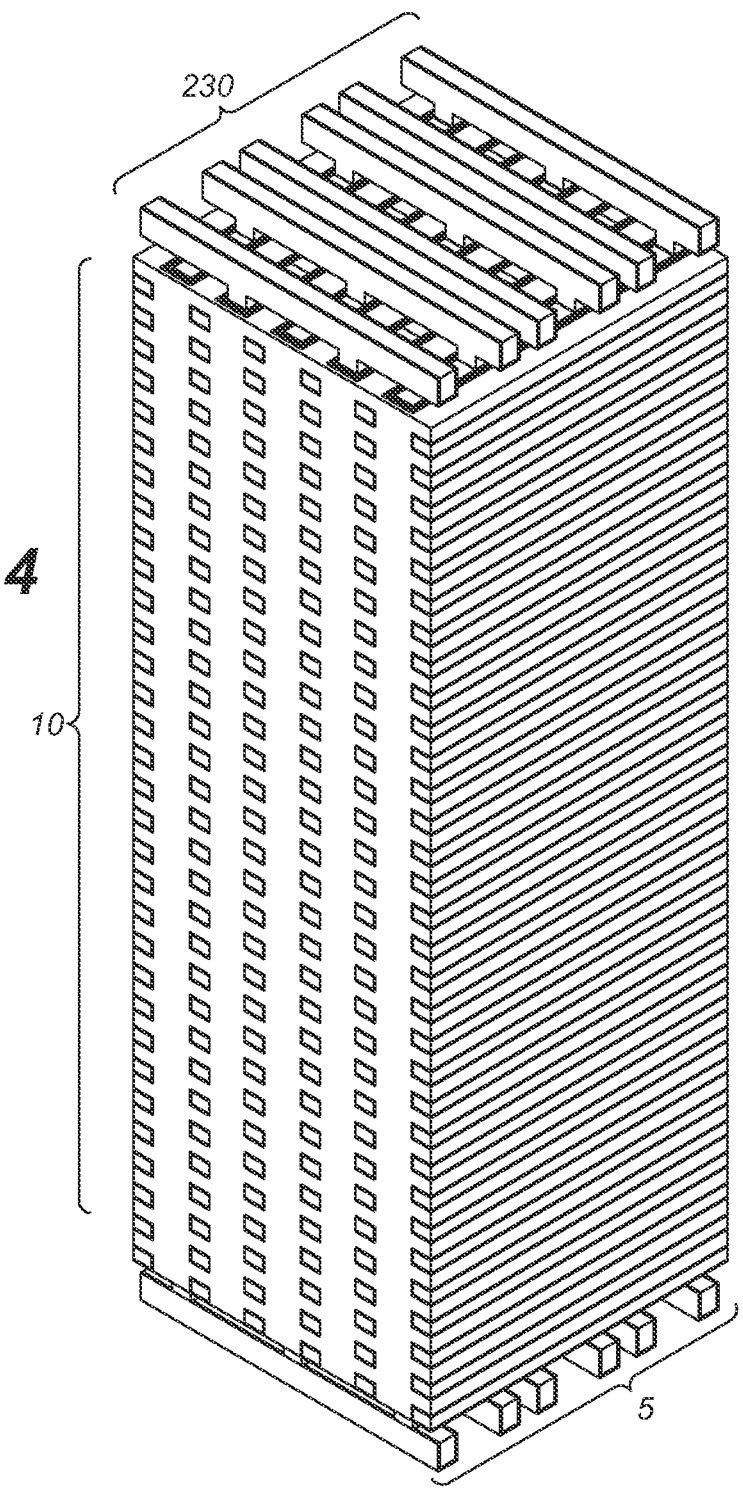

FIG. 14 shows a second set of global interconnect lines 230 provided above memory structure 10 for contacting drain semicoductor layers 220.

Figure 15:
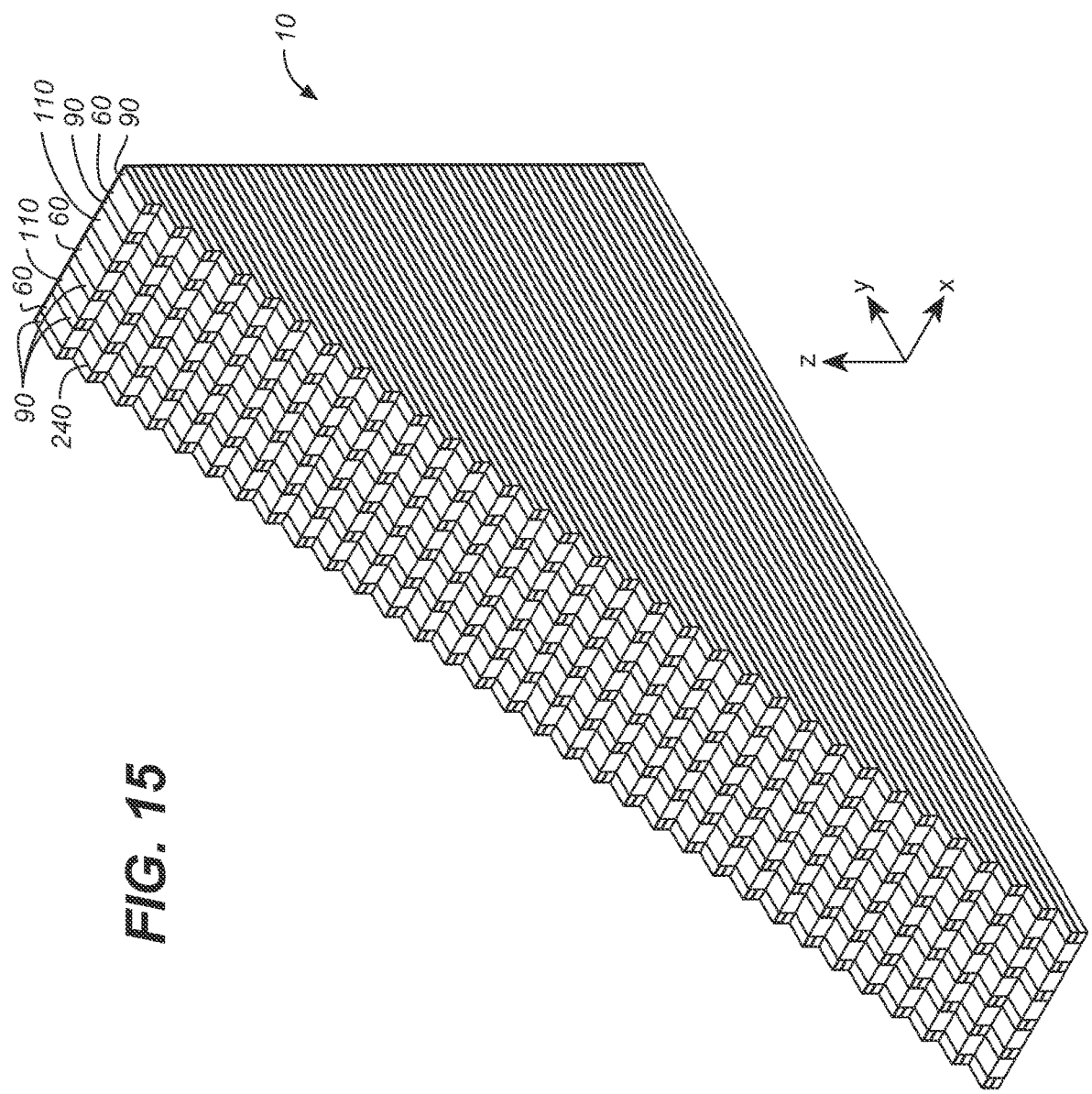

FIG. 15 shows a staircase structure to enable contacting local word lines 240 of memory structure 10.

Figure 16:
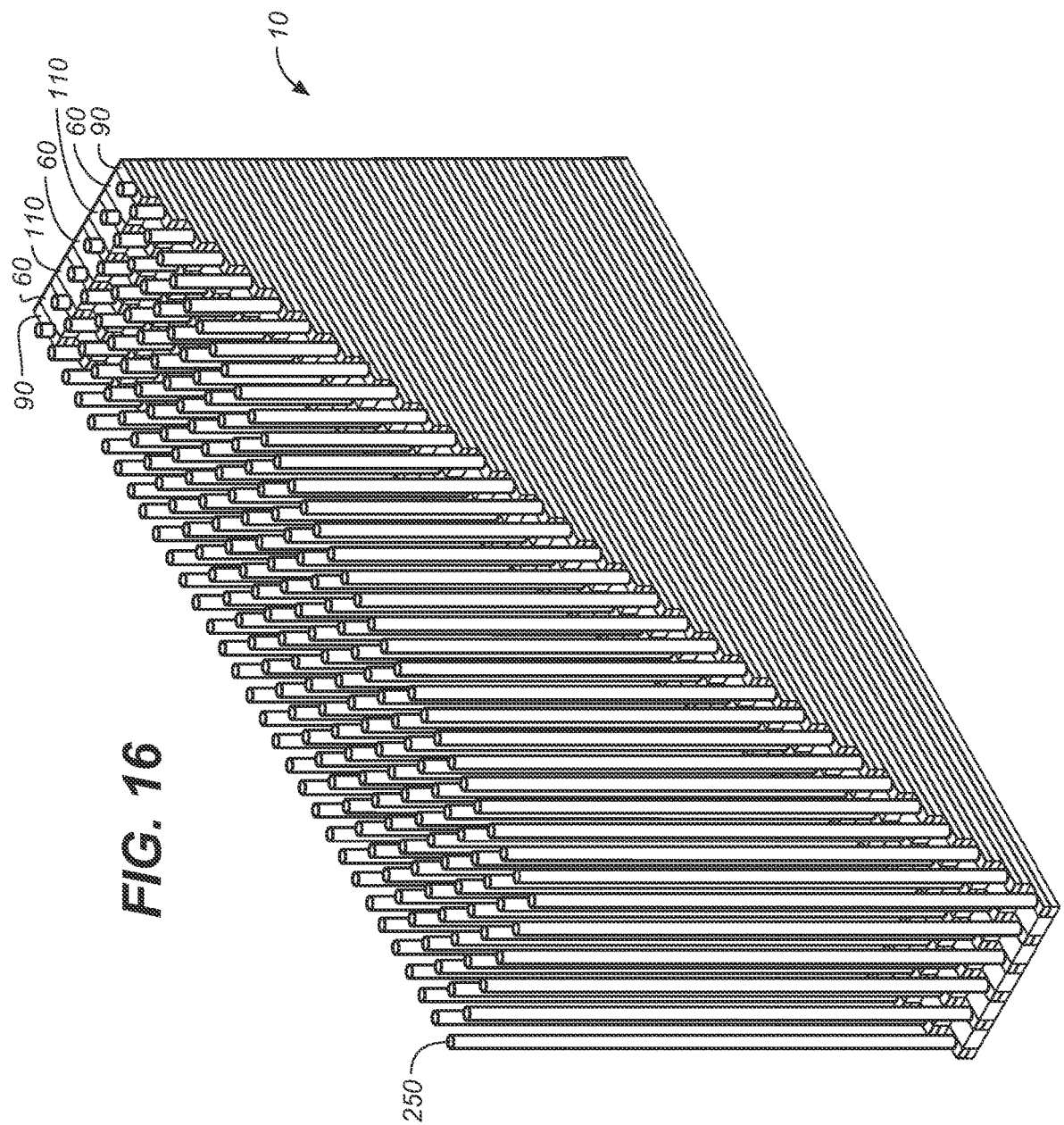

FIG. 16 shows vias and conductors 250 in the staircase structure of FIG. 15 to enable contacting of local word lines 240.

Figure 17A:
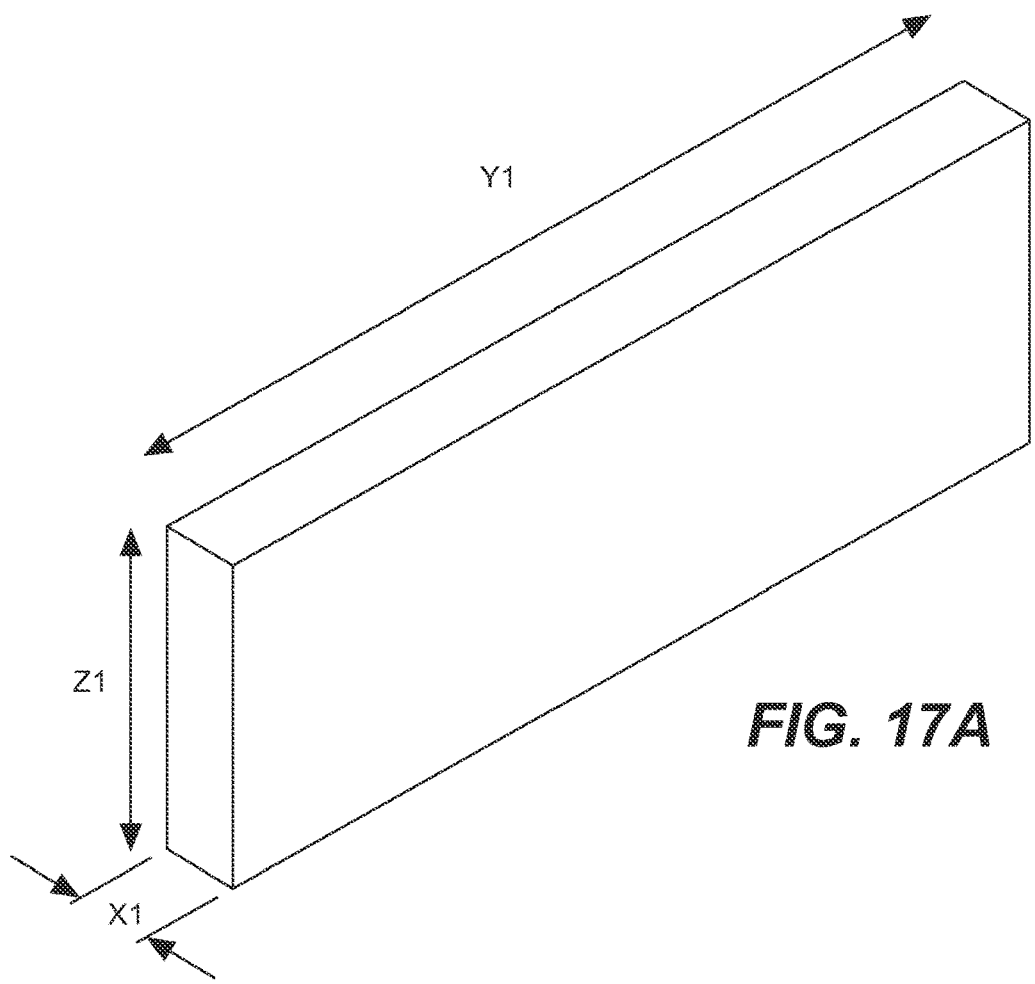
Figure 17B:
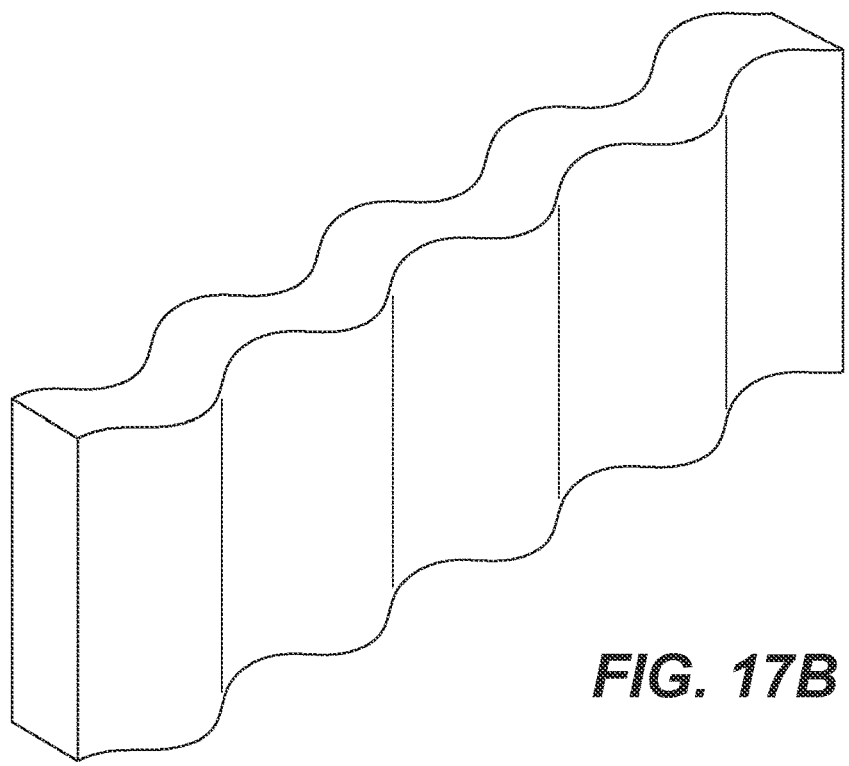

FIGS. 17A and 17B illustrate the phenomenon of ribboning, which is a stress-induced deformation of a microscopic rectangular feature.

FIGS. 18-21, in conjunction with FIGS. 4-16 above, illustrate fabrication of memory structure 10, according to a second embodiment of the present invention.

FIGS. 22-29, in conjunction with FIGS. 8-16 above, illustrate fabrication of memory structure 10, according to a second embodiment of the present invention.

To facilitate both cross-referencing among the figures and simplification of the detailed description, like elements in the figures are assigned like reference numerals.

DETAILED DESCRIPTION OF THE PREFERRED EMBODIMENT

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps.

FIG. 1 shows memory structure 10 provided on and isolated from a conductive layer ("global interconnect lines") 5 on planar surface 15 of a semiconductor substrate. The normal to planar surface 15 is along a first direction (Z-direction). The conductors in global interconnect lines 5 include numerous conductors, each extending along a second direction (X-direction) orthogonal to the Z-direction. The conductors in conductive layer 5 are each separated and insulated from its neighboring conductors along a third direction (Y-direction, substantially orthogonal to both the X-direction and the Z-direction). Global interconnect lines 5 provide electrical connectivity between vertical local word lines yet to be formed, and control, decode, voltage sources and sense circuits formed in the semiconductor substrate (not shown). Such connectivity can be either directly, or through select transistors (not shown).

Global interconnect lines 5 may include any suitable conductive material such as tungsten (W), titanium nitride (TiN), titanium (Ti), tantalum (Ta), chrome (Cr), molybdenum (Mo), cobalt (Co), or any combination of these materials. As shown in FIG. 1, memory structure 10 includes 32 multi-layers (e.g., multi-layer 20), each of which may include, for example, silicon nitride (SiN) layer 30 and silicon oxide ($SiO_2$) layer 40. Alternatively, layer 30 may include, for example, a p-doped or n-doped silicon or silicon germanium, rather than silicon nitride. Each of the layers in each multi-layer may be deposited using any suitable technique, e.g., low pressure chemical vapor deposition (LPCVD), plasma enhanced chemical vapor deposition (PECVD), atomic layer deposition (ALD, itself a form of CVD), sputtering, or evaporation, most preferably by PECVD. Although FIG. 1 shows 32 multi-layers, the number of multi-layers in memory structure 10 can be any suitable number (e.g., one, two, sixteen, sixty-four, or more). After depositing memory structure 10, a masking layer (e.g., a carbon-based masking layer) is deposited and patterned to form masking structures 50 using a photoresist layer (not shown) Masking structures 50 each have width $L_2$ and each separating from its neighboring masking structures by trenches of width $L_1$, with width $L_2$ preferably not less than twice desired width $L_1$. Width $L_1$ defines the desired width of the trenches between the active strips to be formed.

Figure 2:
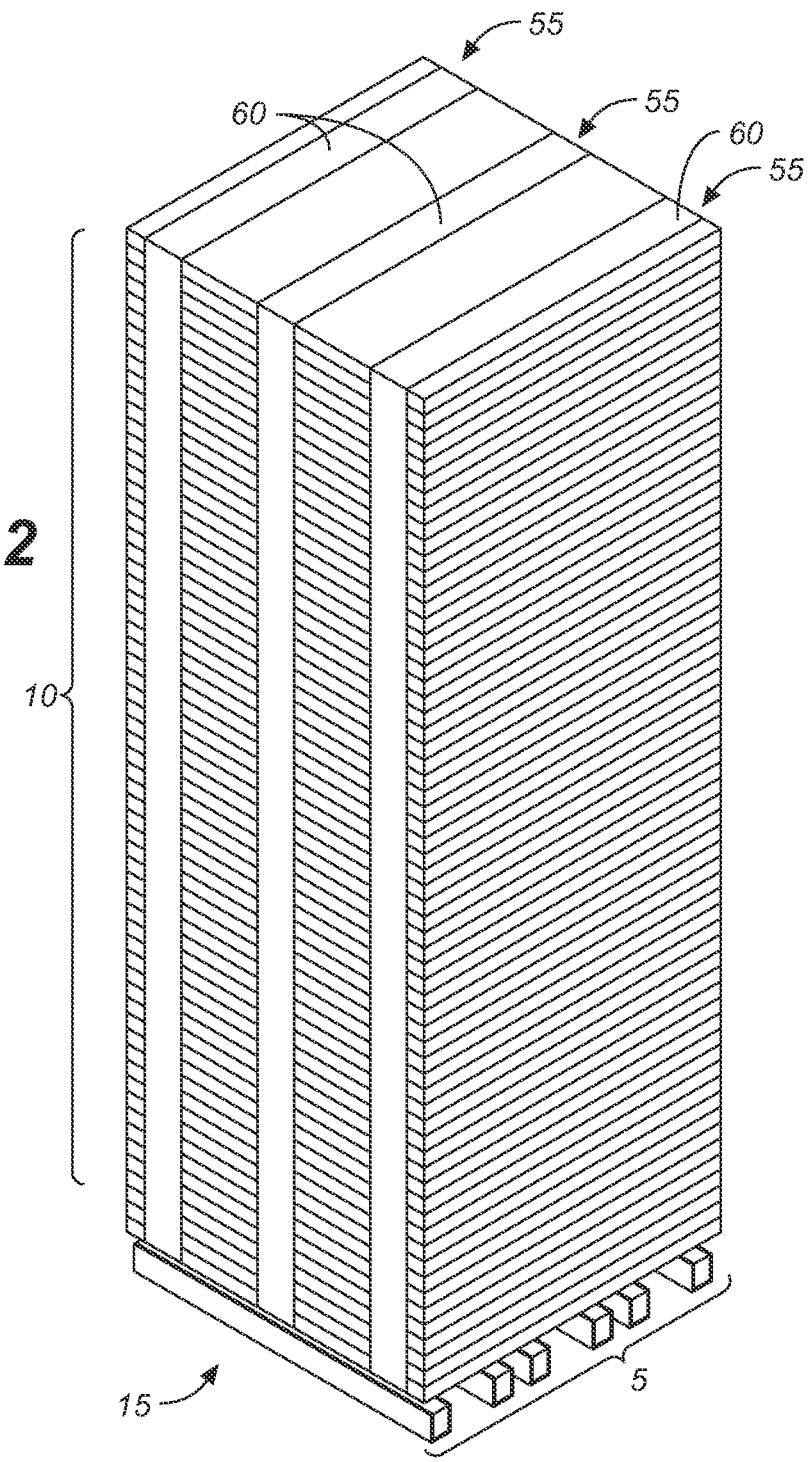
FIG. 2 shows sacrificial dielectric layer 60 filling trenches 55, with excess dielectric material deposited on the top of memory structure 10 removed.

A first set of trenches 55 are then created by etching through the multi-layers of memory structure 10 using masking structures 50, followed by removal of masking structures 50. FIG. 2 shows sacrificial dielectric layer 60 filling trenches 55, with excess dielectric material deposited on the top of memory structure 10 removed. Removal of sacrificial dielectric layer 60 from the top of memory structure 10 may be accomplished using any suitable technique, such as chemical-mechanical polishing (CMP) or etchback, most preferably CMP. Sacrificial dielectric layer 60 may include any suitable material (e.g., $SiO_2$, porous $SiO_2$, boron doped $SiO_2$ (BSG), phosphorus doped $SiO_2$ (PSG), boron phosphorus doped $SiO_2$ (BPSG), SiOH, SiCOH, any combination of these materials, or any suitable material). Most preferably, sacrificial dielectric layer 60 is formed out of a material that can be etched much faster than SiN layer 30 and $SiO_2$ layer 40.

Figure 3:
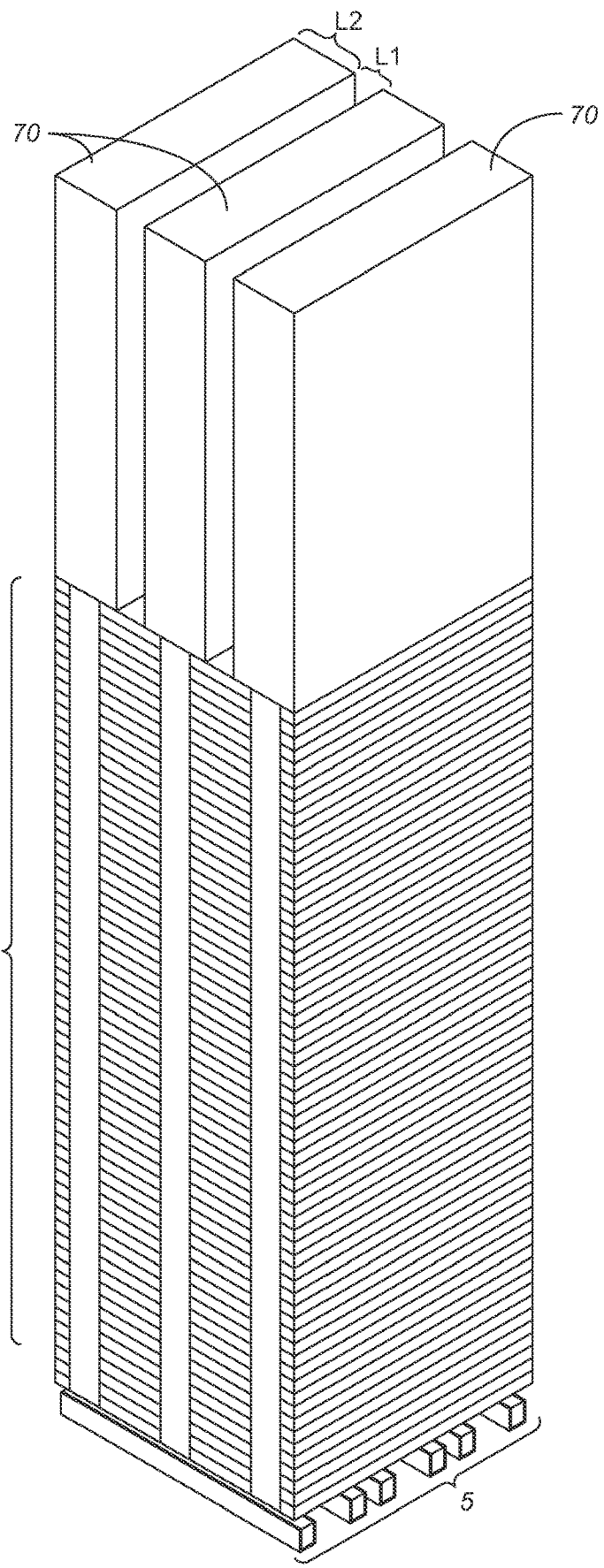
FIG. 3 shows another masking layer deposited on memory structure 10 and patterned to form masking structures 70.
Figure 4:
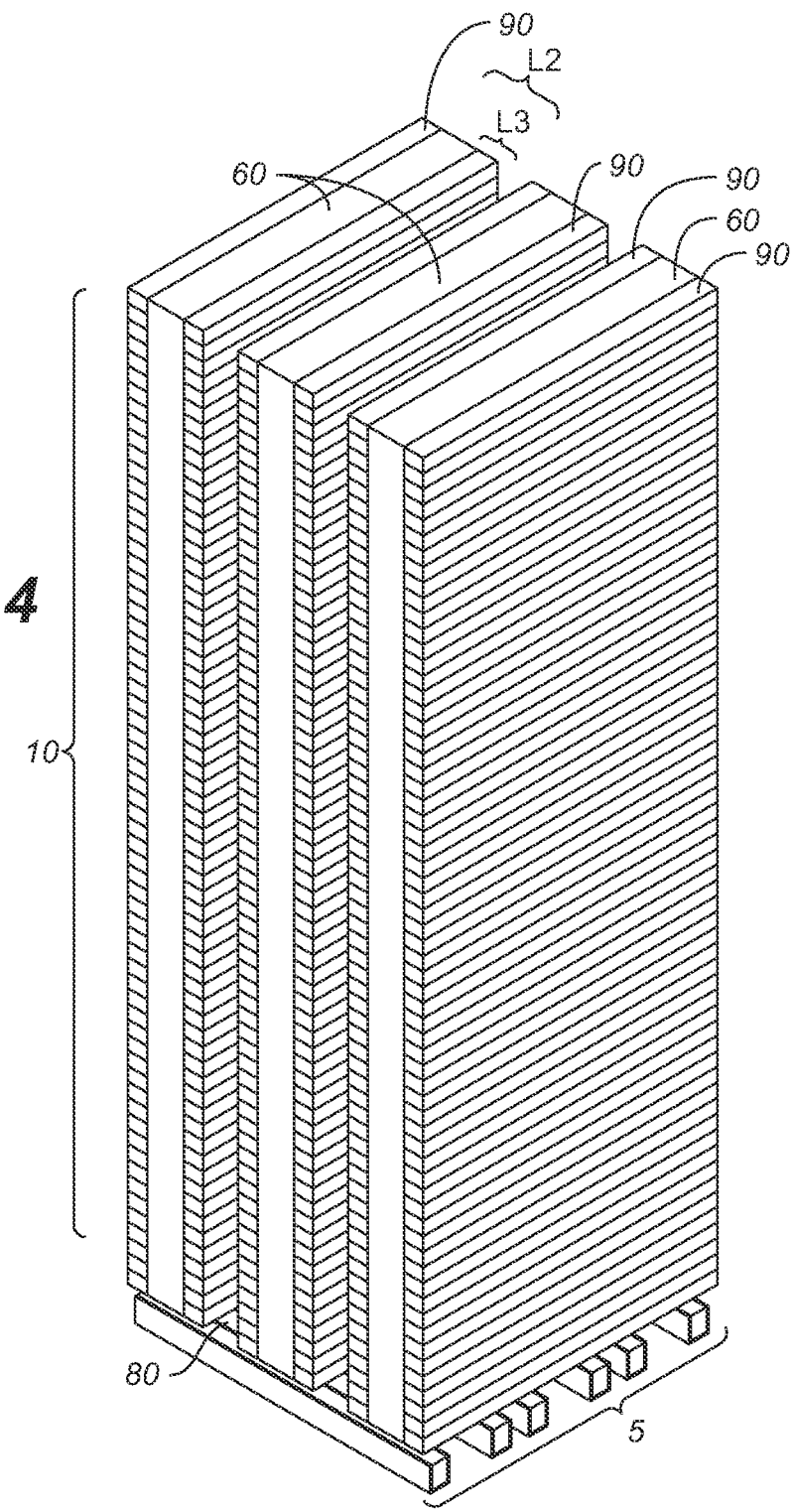
FIG. 4 shows second set of trenches 80 fromed by etching through the multi-layers of memory structure 100, forming multi-layer stacks 90.

Thereafter, another masking layer is deposited on memory structure 10 and patterned to form masking structures 70, as shown in FIG. 3. Masking structures 70, each of which extends over sacrificial dielectric layer 60 in one of trenches 50 and portions of the multilayers on both sides of that trench, are separated from each other by width $L_1$ (as in masking structures 50) to define second set of trenches 80 that are parallel to first set of trenches 55. FIG. 4 shows second set of trenches 80 fromed by etching through the multi-layers of memory structure 10, thus forming narrow multi-layer stacks ("word line stacks") 90 each extending along the Y-direction. Each multi-layer in each word line stack forms a "word line strip.". Word line stacks 90 each have width $L_3$ that is much less than width $L_2$ of masking structures 50 and 70. By using a relative large $L_2$ value in masking structures 50 and 70, a problem known as "ribboning" is avoided.

(FIGS. 17A and 17B illustrate the phenomenon of ribboning, which is a stress-induced deformation of a microscopic rectangular feature. FIG. 17A shows a microscopic rectangular feature (e.g., a feature formed out of developing a masking material) with intended dimensions width X1, length Y1 and height Z1. In some manufacturing processes, when the aspect ratio Z1/X1 exceeds 10, the stress in the rectangular feature may lead to deformation along length Y1, such that the resulting feature "ribbons" from an intended straight line to become a series of connected S-curves, such as shown in FIG. 17B. Ribboning is more acute with smaller widths, especially when width X1 is scaled below approximately 45 nm.)

In practice, due to limitations of existing lithography tools, some misalignment may occur, so that the overlaps of each masking structure 70 over the left and right stacks underneath it are not exactly equal. For example, if the target width $L_3$ is 50 nanometers and the worst-case misalignment is ±5 nanometers, then the left-side overlap may be as much as 55 nanometers wide, while the right-side overlap may be as narrow as 45 nanometer wide. This manufacturing variability in width causes into variability of the width of the yet to be formed even and odd metallic conductor word lines. In turn, the variability in width may cause higher electrical resistance of the narrower word lines. Such variability can be absorbed within the chip design, for example by treating the left and right side thin-film transistors of each stack as belonging to two separate groups, with each group being provided with its dedicated reference transistors or reference memory strings that are constituted from within their respective groups.

Figure 5:
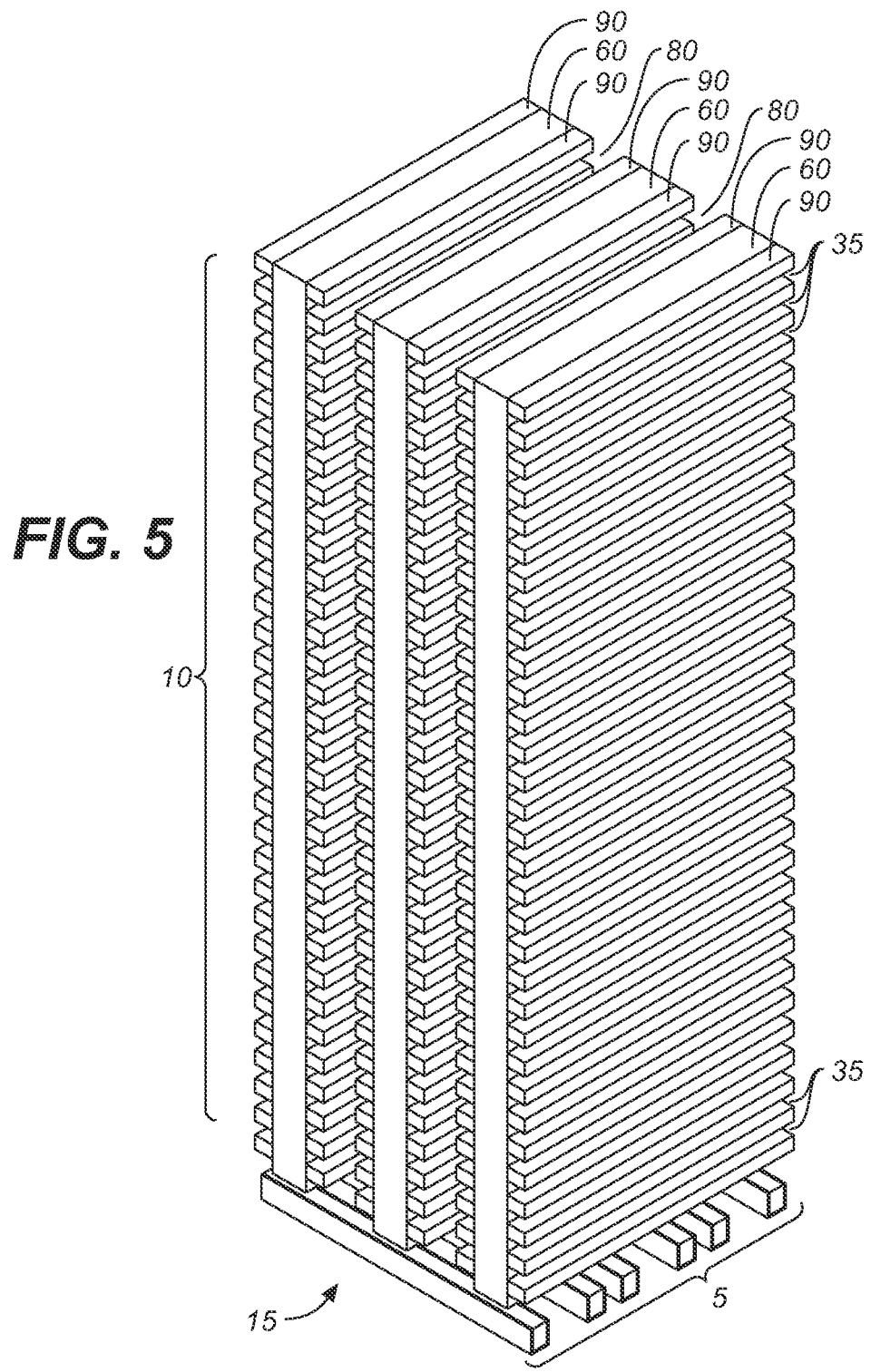
FIG. 5 shows memory structure 10 with cavities 35 after removal of SiN layer 30 in each mult-layer by a selective etch.

Next, as shown in FIG. 5, SiN layer 30 of each word line strip in memory structure 10 are removed by a selective etch. SiN layer 30 may be removed using any suitable technique, such as a corrosive gas or a wet chemical acid or base. For example, SiN layer 30 may be removed by wet etching in phosphoric acid heated to 180° C. Etching stops when each SiN layer 30 is etched all the way to sacrificial dielectric layer 60 in trenches 55. As sacrificial dielectric layer 60 in trenches 55 are not materially etched, their support allows word line stacks 90 to maintain their intended structural forms (i.e., each narrow, long and tall along the entire length), even though the constituent SiN layer 30 in each word line strip is removed, thereby creating cavities or discontinuities 35 in word line stacks 90. Note that braces spanning between adjacent stacks 90 and placed at suitable intervals may not be needed to support the narrow active stacks under existing state-of-the-art technology. However, such braces may be required in the future for highly scaled 3-dimensional memory arrays when width $L_3$ becomes even narrower, or when the word line stacks are exceedingly tall (e.g., the number of word line strips is exceedingly large), so that it becomes prudent to support the very long word line stacks at suitable intervals.

Figure 6:
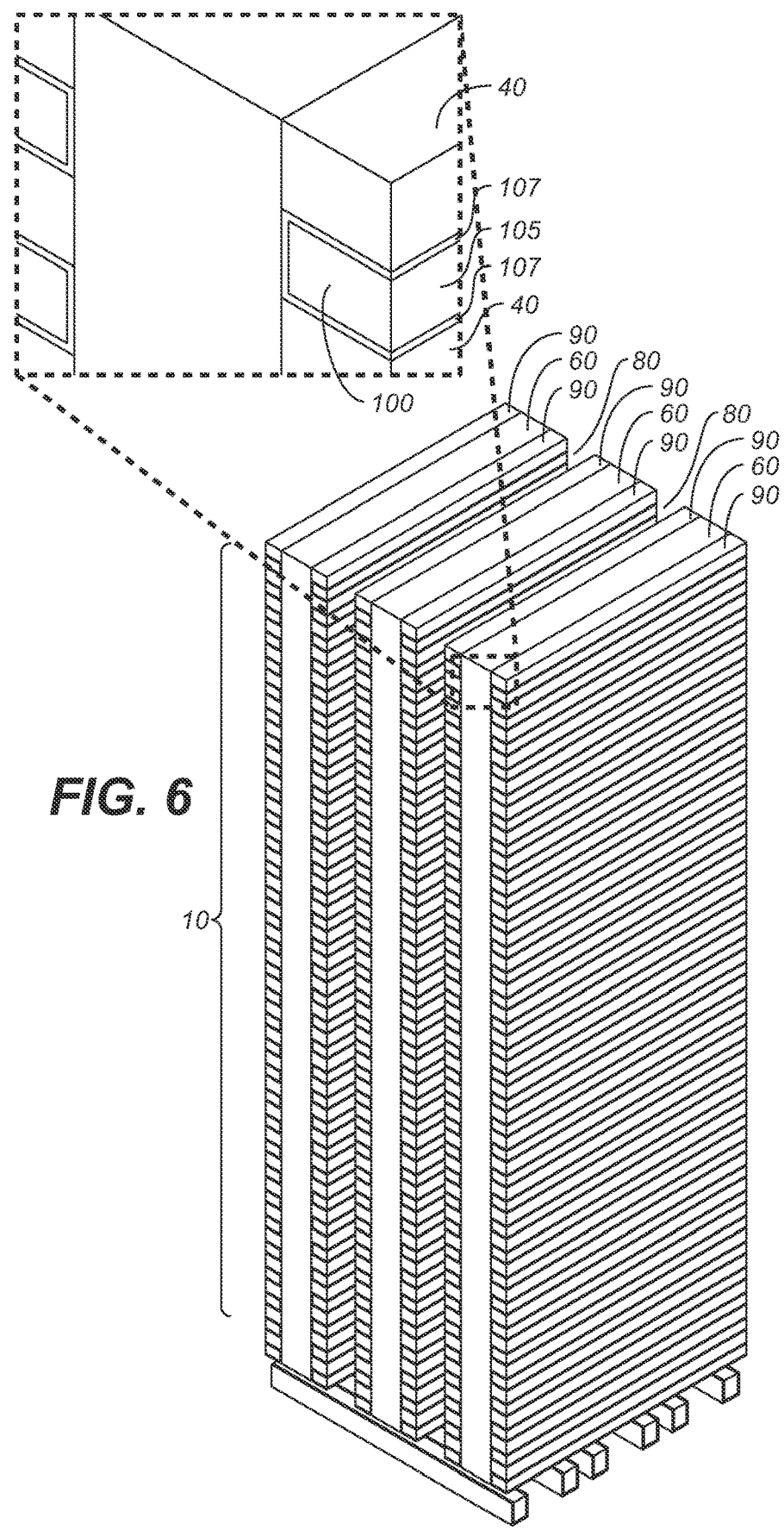
FIG. 6 shows metal layer 100 filling cavities 35 of the word line strips of memory structure 10.
Figure 7:
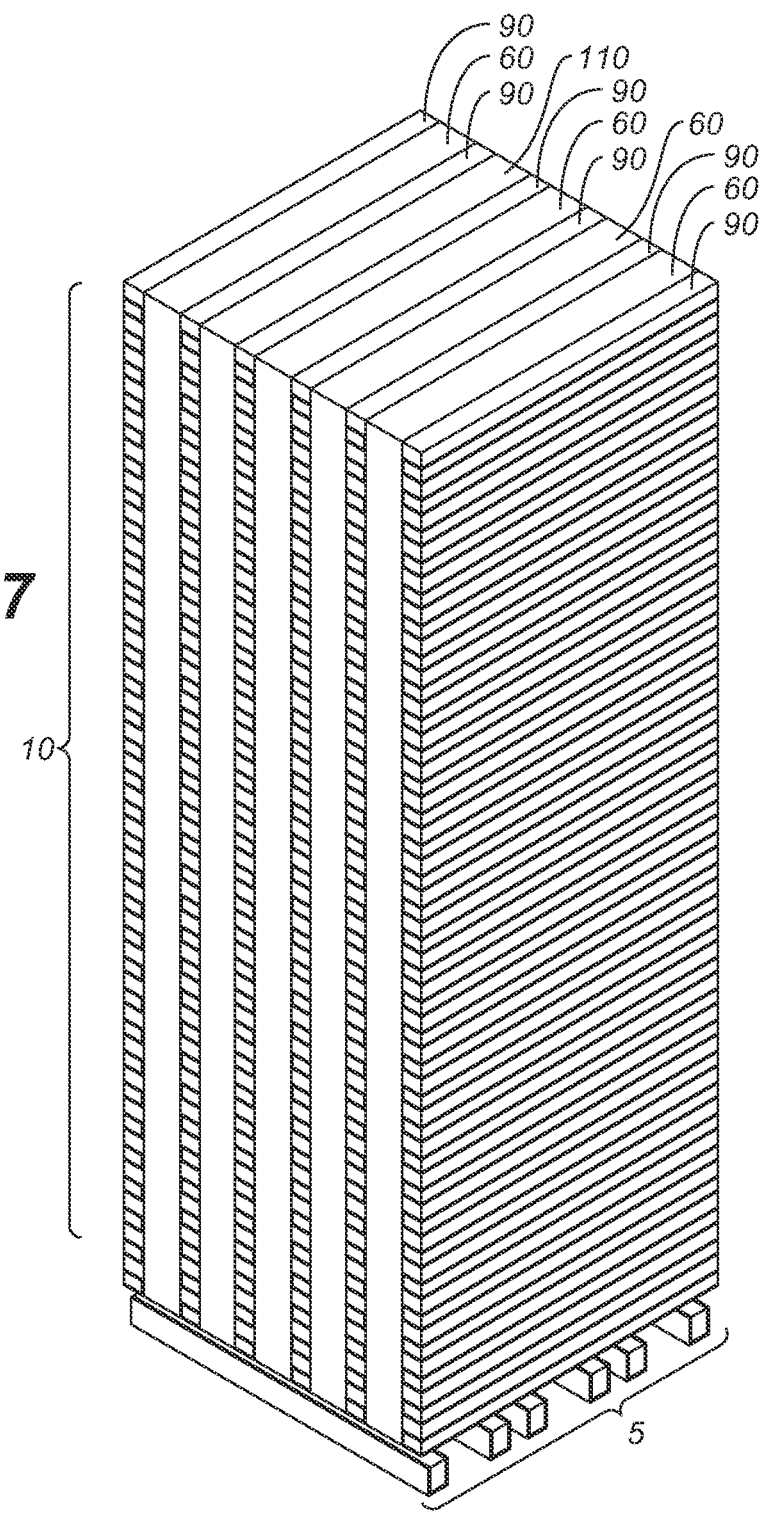
FIG. 7 shows sacrificial dielectric layer 110 in trenches 80, after excess sacrificial dielectric material is removed from the top surfaces of memory structure 10 by any suitable planarization technique, such as CMP.

One or more metal layers are then provided to form metal layer 100, which fills cavities 35 in each word line strip. Metal layer 100 is then removed from the sidewalls of trenches 80 by a suitable etch, leaving metal layer 100 only in the word line strips, as shown in FIG. 6. In some embodiments, metal layer 100 is further recessed by selectively etching up to approximately 6 nanometers away from the sidewalls of trenches 80, so as to accommodate an oxide cap layer or silicon barrier cap layer to be placed therein, as is known by those of ordinary skill in the art. The oxide cap layer or silicon barrier cap layer separates metal layer 100 from directly contacting a charge trapping layer yet to be formed. Metal layer 100 may be any suitable material, such as TiN, TaN, Ta, W, Mo, or any combination of these metals, deposited by any suitable technique, such as ALD, CVD, PVD, sputtering, evaporation, or any suitable combination of these techniques, most preferably ALD for a liner metal like TiN and CVD for a filler material such as W or Mo. As shown in FIG. 7, a combination of tungsten layer 105 between thiner TiN layer 107 form metal layer 100.

FIG. 7 shows sacrificial dielectric layer 110 deposited in trenches 80, after excess sacrificial dielectric material is removed from the top surfaces of memory structure 10 by any suitable planarization technique, such as CMP. Sacrificial dielectric layers 60 and 110 are then patterned using photolithography and etched to provide elongated vias 120 that extend through the height of memory structure 10 (i.e., along the Z-direction), exposing the sidewalls of word line stacks 90, as shown in FIG. 8. Adjacent ones of vias 120 in each trench is separated by a predetermined distance, such as the length along the Y-direction of each via 120.

The following films are then successively deposited conformally in elongated vias 120: (i) tunneling dielectric layer 130, (ii) charge storage layer 140, (iii) blocking dielectric layer 150, (iv) channel layer 160, (v) and optional liner layer 170, and (vi) sacrificial dielectric layer 180. These layers may be deposited using any suitable technique, e.g., as LPCVD, CVD, ALD, PVD, or evaporation, most preferably LPCVD and ALD. Tunneling dielectric layer 130 may be any suitable material for which charge carriers may tunnel through (e.g., silicon dioxide). Tunneling dielectric layer 130 may be any suitable thickness (e.g., 0.5 to 10.0 nm). Charge storage layer 140 may be any suitable material, such as: (i) SiN or silicon rich SiN, in any suitable form (e.g., amorphous, nanocrystalline or polycrystalline), or (ii) germanium nanocrystals in a silicon nitride, silicon oxide matrix, silicon oxide, or silicon-rich silicon oxide. Charge storage layer 140 may be any suitable thickness (e.g., 0.5 to 20 nm). Blocking dielectric layer 150 may be silicon oxide, silicon nitride, silicon oxide nitride, aluminum oxide, or hafnium oxide, or any suitable combination of these materials. Blocking dielectric layer 150 may be any suitable thickness sufficient to block charge carriers from passing through (e.g., 3 to 30 nm).

Channel layer 160 is a suitable n-type or p-type semiconductor material (e.g., silicon, silicon germanium, or indium gallium zinc oxide (IGZO), or zinc oxide) with a suitable thickness (e.g., 2 to 30 nm) and typically in-situ relatively lightly doped or undoped. Sacrificial dielectric layer 180 may include any suitable material, such as $SiO_2$, porous $SiO_2$, boron-doped $SiO_2$ (BSG), phosphorus-doped $SiO_2$ (PSG), boron-phosphorus-doped $SiO_2$ (BPSG), SiOH, SiCOH, or any combination of these materials. Optional liner layer 170 is a material suitable for serving as as etch-stop for a yet to be performed etch of sacrificial dielectric layer 180 (e.g., aluminum oxide or silicon nitride) with any suitable thickness (e.g., 0.5 to 5 nm). After deposition of these layers conformally into vias 120, excess material may be removed from the top of memory structure 10, followed by planarization using any suitable technique, such as CMP.

Thereafter, the steps of creating vias of FIG. 8 is repeated to create vias 125 by removing the remaining portions of sacrificial dielectric layers 60 and 110 of trenches 55 and 80, while protecting the deposited layers in vias 120. The same materials are then deposited conformally in vias 125 as in vias 120: (i) tunneling dielectric layer 130, (ii) charge storage layer 140, (iii) blocking dielectric layer 150, (iv) channel layer 160, (v) optional liner layer 170, and (vi) sacrificial dielectric layer 180. The resulting structure is shown in FIG. 10. In FIG. 10, the dielectric material in trenches 55 and 80 are now replaced by adjacent columns of successively deposited layers between word line stacks 90. The charge storage material in this second set of shafts may have different characteristics, if desired, than those of the charge storage material in the earlier set of shafts.

Shafts 200 are then defined in sacrificial dielectric layer 180 using photolithography and etched, as shown in FIG. 11. Each of shafts 200 extends from the top of memory structure 10 down to global interconnect lines 5 through openings in the isolation layer between memory structure 10 and global interconnect lines 5. During etching of shafts 200, which may be a high-power dry etch of sacrificial dielectric layer 180, the sidewalls of channel layer 160 are protected by liner layer 170, which is resistant to the etch. As shown in FIG. 11, adjacent shafts along the X-direction are aligned to each other, however alternatively they can be staggered relative to each other. Only every other adjacent shafts of shafts 200 along the X-drection are exposed to the same conductor in underlying global interconnect lines 5. The portion of liner layer 170 exposed in each of shafts 200 is then removed, for example, by a wet etch which does not damage underlying channel layer 160.

Each of shafts 200 is then filled with semiconductor material 210, which form a common source region for the thin-film transistors to be formed along that via. Source semiconductor layer 210 may be any suitable heavily n-doped or p-doped material, such as silicon, germanium, or silicon germanium. Alternatively the shafts are only partically filled along their walls with the deposited source material, the remaining space in the cavity is then filled with a low-resistivity material such as TiN or Tungsten (not shown). Any portion of semiconductor layer 210 covering the top of memory structure 10 may be removed using a planarisation technique. such as CMP. The resulting structure is shown in FIG. 13. Source semiconductor layer 210 is electrically connected to the global interconnect lines 5.

Drain semiconductor layers 220 are provided by repeating the steps of defining and etching vias in sacrificial dielectric layer 180, etching liner layer 170 and filling vias with a heavily n-doped or p-doped semiconductor layer 210 of FIGS. 11-12, except that etching of vias for drain semiconductor layer 220 does not punch-through to global interconnect lines 5, so that drain semiconductor layer 220 does not contact global interconnect lines 5. The resulting structure is shown in FIG. 13. Source semiconductor layers 210 are marked by an "X" in FIG. 13. A second set of global interconnect lines, labeled global interconnect lines 230 above memory structure 10 for contacting local drain semicoductor layers 220, as shown in FIG. 14, forming global bit lines that connect every other adjacent shaft 220, either directly or through selection transistors, to circuitry in the substrate. At this point, source semiconductor region 210 and drain semiconductor layer 220 of each of shafts 200 form the common source region and the common drain regions ("bit lines") of thin-film storage transistors of a vertical NOR-type (VNOR) memory string, each thin-film transistor being formed at the lateral overlapping region between a word line strip 100 and channel layer 160, tunnel dielectric layer 130, charge storage layer 140 and blocking dielectric layer 150. In one embodiment, each word line strip 100 controls NOR-type memory transistors on each of its side edges.

In a VNOR memory array according to the present invention, a typical nominal minimum width $L_1$ of a word line strip is 50 nanometers, while the nominal minimum width of trench 55 or 80 separating adjacent word line stacks may be 80 nanometers, and the height of a word line stack with 32 active layers may exceed 2,000 nanometers (2 microns). The aspect ratio of a stand-alone word line stack of 50 nanometer width would therefore be 2000/50, or 40:1, which would be severely challenging to remain standing erect during an etch, let alone through successive process steps, which would adversely impact yields and cost. However, using a method according to the present invention, the width $L_2$ of each masking structures 50 and 70 of FIGS. 1 and 3 is 50+80+50=180 nanometers, therefore the aspect ratio of an etch using masking structures 50 or 70 is 2,000/180, or 11:1.

In some embodiments, for die size considerations, it may be advantageous to place some circuitry (e.g., decoding circuits, and some read, write and erase supply voltage sources) that is electrically connected through global interconnect lines 5 or global interconnect lines 230 in a part of the semiconductor substrate that is directly underneath memory structure 10. (These decoding circuits and voltage sources are not shown in FIG. 14.) Electrical connections between global interconnect lines 5 and these circuits in the semiconductor substrate are readily available. To electrically connect these circuits in the semiconductor substrate to global interconnect line 230 above memory structure 10 may require providing additional vertical connectors on one or more sides of memory structure 10 as well as conductors positioned between global interconnect lines 230 and the circuits in the semiconductor substrate. In one embodiment, such circuitous paths may be avoided by providing vertical conductors connecting global word lines 220 to the circuits in the semiconductor substrate directly through the densely packed memory structure 10 and the densely spaced global interconnect lines 5. These vertical conductors may be implemented by having selected ones of local vertical source semiconductor layer 210 or local vertical drain semiconductor layer 220 to also serve as conductors for connecting to the circuits in the semiconductor substrate. When used in that manner, one option is to fill the vias with a more conductive material (such as metal) instead of a heavily doped semiconductor. To establish electrical paths using these vertical conductors may require an extra mask and an etch step to punch-through via openings at the bottom of their respective shafts at locations directly above or close to where such circuits are placed in the semiconductor substrate.

In some embodiments, global interconnect lines 5 underneath memory structure 10 need not be formed when vertical local source semiconductor layer 210 and vertical local drain semiconductor layer 220 are all connected to global interconnect lines 230 formed above memory structure 10. Such an arrangement obviates the punch-through masking and etch steps required to connect source semiconductor layer 210 to global interconnect lines 5. Conversely, semiconductor layer 210 and drain semiconductor layer 220 may all be contacted through the punch-through vias to global interconnect lines 5 at the bottom of memory structure 10. In either case, one of the two sets of global interconnect lines may be obviated, provided that the global interconnect lines have approximately one-half the pitch of global interconnect lines 5 or global interconnect lines 230, which may require double exposures or more advanced lithography.

Connections to the local word lines are made by a "staircase" method. In a staircase structure, the word line strips in a word line stack are cut to successively greater lengths to allow vertical conductors to contact the local word lines of successive word line strips at the steps. A similar method to form staircase structures is disclosed, for example, in Provisional Application IV incorporated by reference above. After memory formation and connection to top and bottom global wordlines, connections to the wordlines are made by a "staircase" method. The staircase structure is made by first providing a masking layer to expose and etch away a portion of the top word line strip in each word line stack exposing metal layer 100 of the word line strip, and successively (i) recessing the masking layer; (ii) etching away a portion of each of the exposed word line strips, exposing a portion of metal layer 100 at each step, until each of word line strips in the word line stack—except the bottom word line strip—has a portion removed as shown in FIG. 15. FIG. 15 shows only an end portion along the length of the word line strips) of memory structure 10. (The portion between the end portions, i.e., the portions containing the thin-film transistors, are the portions shown in FIGS. 1-14.) Using a photoresist recess technique discussed, for example, in Provisional Application IV, a masking layer is recessed along the Y-direction from one or both ends without an additional photo-lithographical step to expose successive word line strips.

A dielectric material is then deposited over the staircase structure and planarized by CMP. FIG. 16 shows that the result dielectric material is patterned and etched for via openings, which are then and then filled with a conductive material (e.g., a refractory metal, such as tungsten) 250 to provide contacts to the ends of word line layer 240 in each active layer exposed by the staircase structure. In this manner, each word line is connected to selective circuitry (e.g., a decoder and a voltage source) in the semiconductor substrate, or on a separate companion integrated circuit. Such an integrated circuit may be connected to circuitry in the semiconductor substrate using a flip-wafer technique (e.g., through a multitude of miniature copper studs between connected wafers) known in the art.

Figure 18:
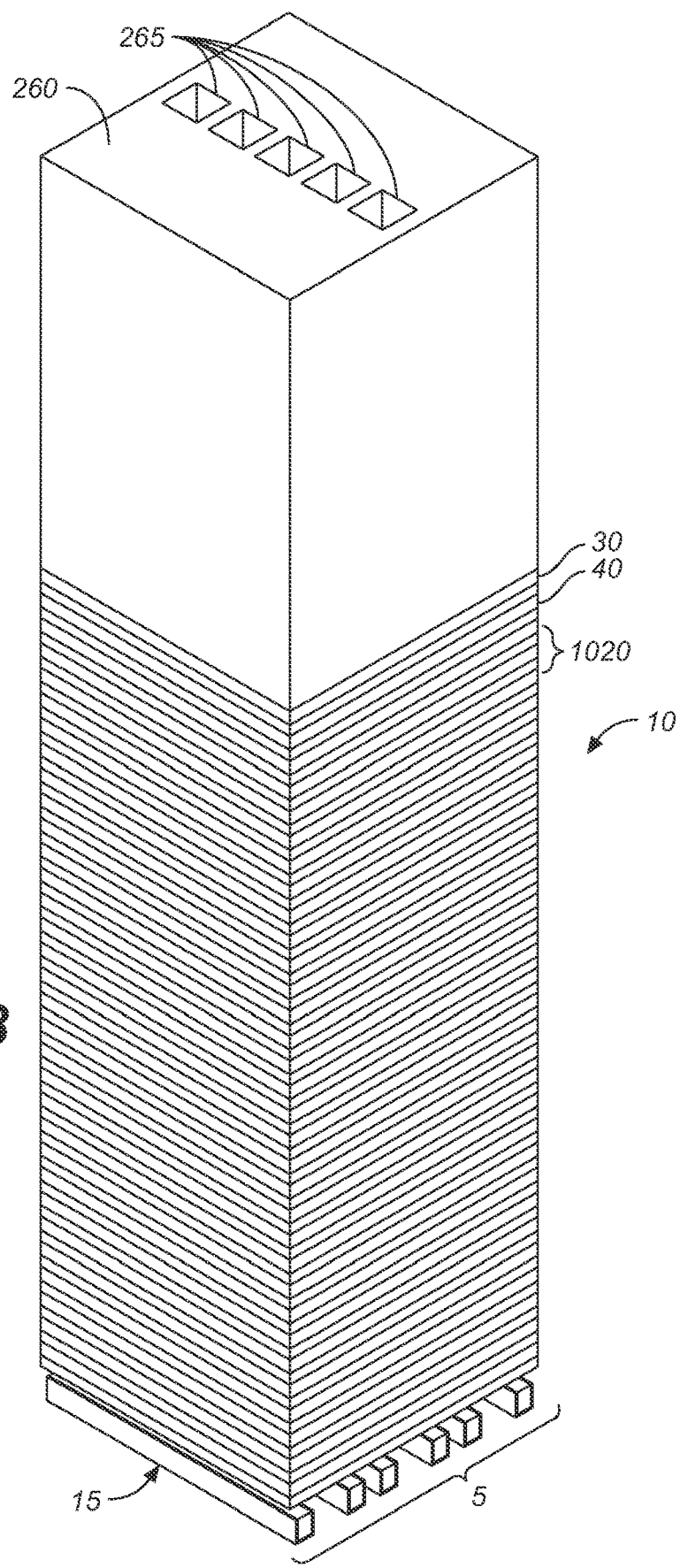
Figure 19:
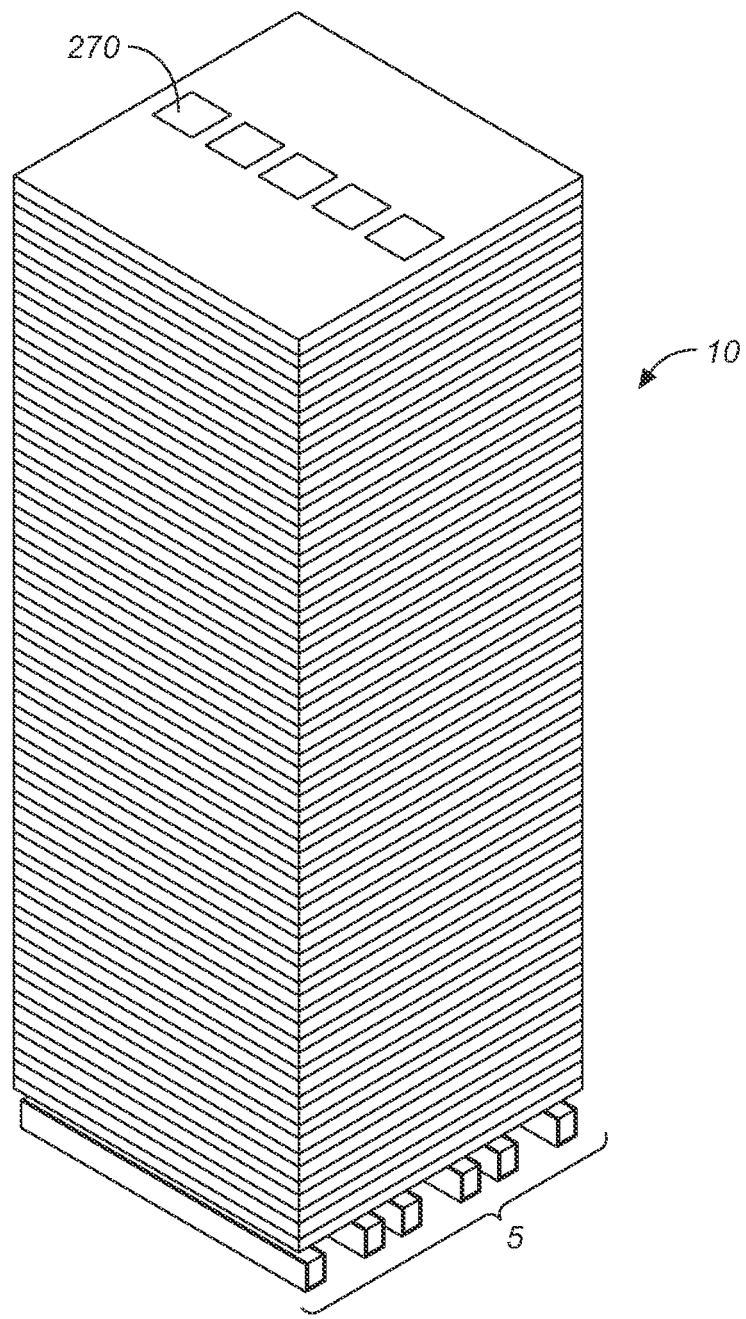

According to another embodiment of the present invention, structural support for high aspect ratio word line strips is provided by dielectric pillars formed prior to word line strip formation. As shown in FIG. 18, memory structure 10—including global interconnect lines are formed, in substantially the same manner as discussed above with respect to FIG. 1. However, unlike mask layer 50 of FIG. 1, mask layer 260 is provided, which is patterned to allow shafts 265 to be etched through the word line stacks. After etching of shafts 265 and removal of mask 260, shafts 265 are filled by s dielectric material to form dielectric pillars 270, with excess dielectric material suitably removed (e.g., by CMP or etch back) from the top of structure 10, as shown in FIG. 19. Suitable dielectric materials for dielectric pillars 270 include any suitable material (e.g., $SiO_2$, SiN, SiON, SiC, SiCOH, PSG, BSG, or BPSG, most preferably $SiO_2$), deposited using any suitable technique (e.g., ALD, LPCVD, or PECVD, most preferably LPCVD).

Figure 20:
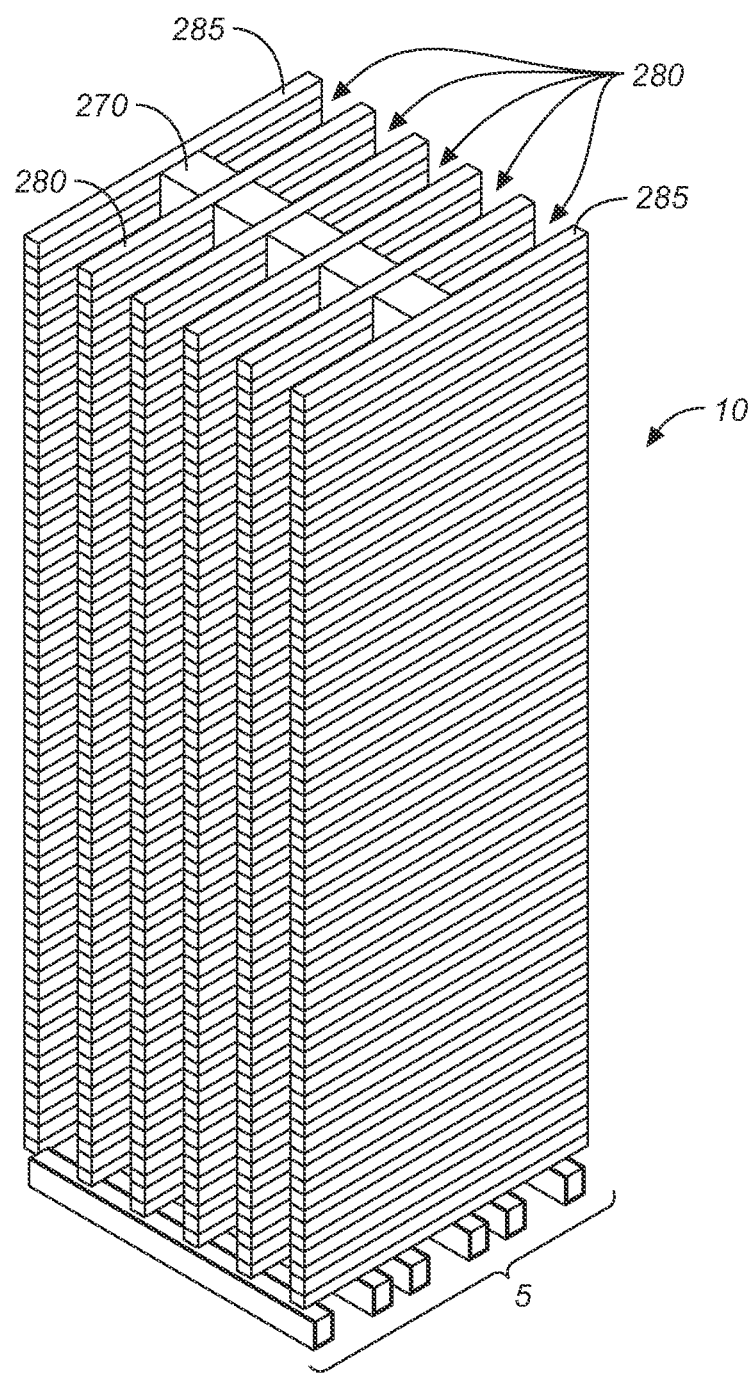
Figure 21:
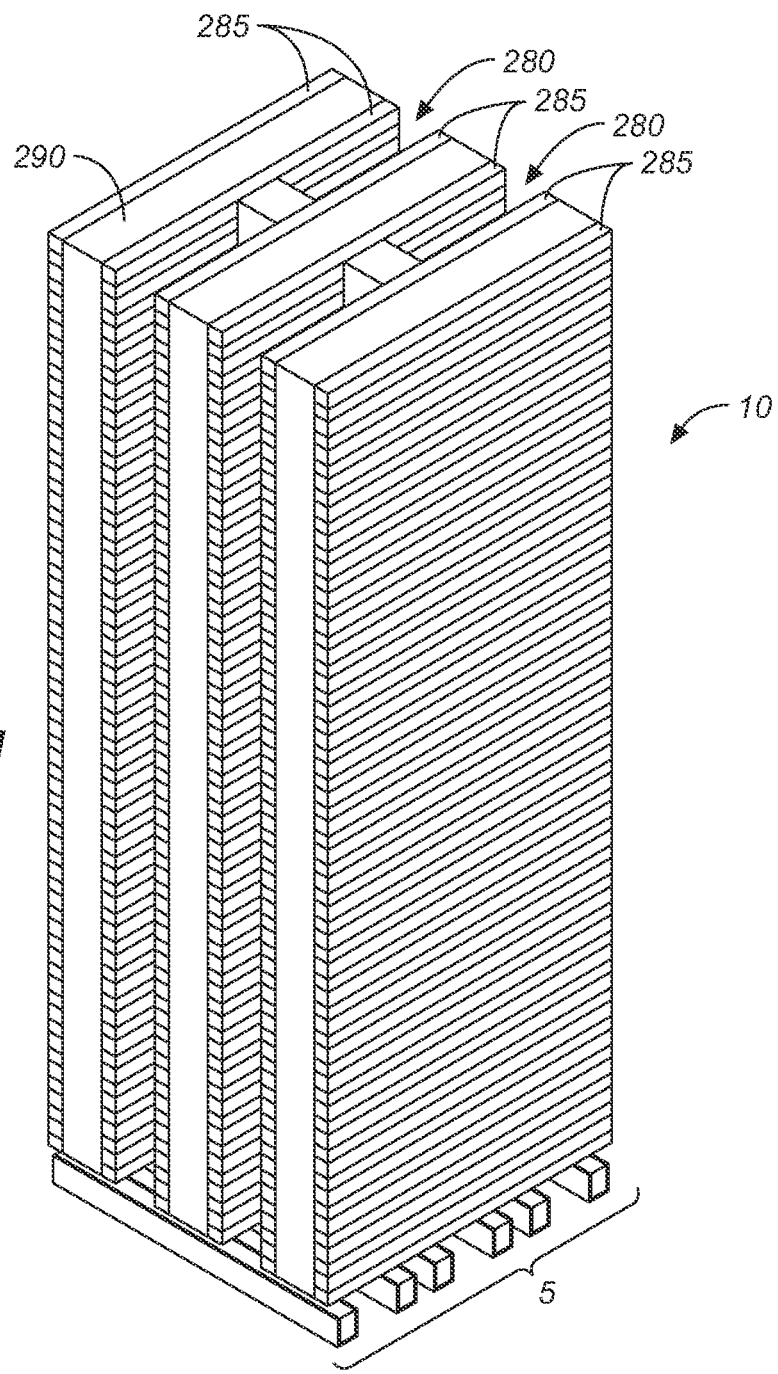
Figure 22:
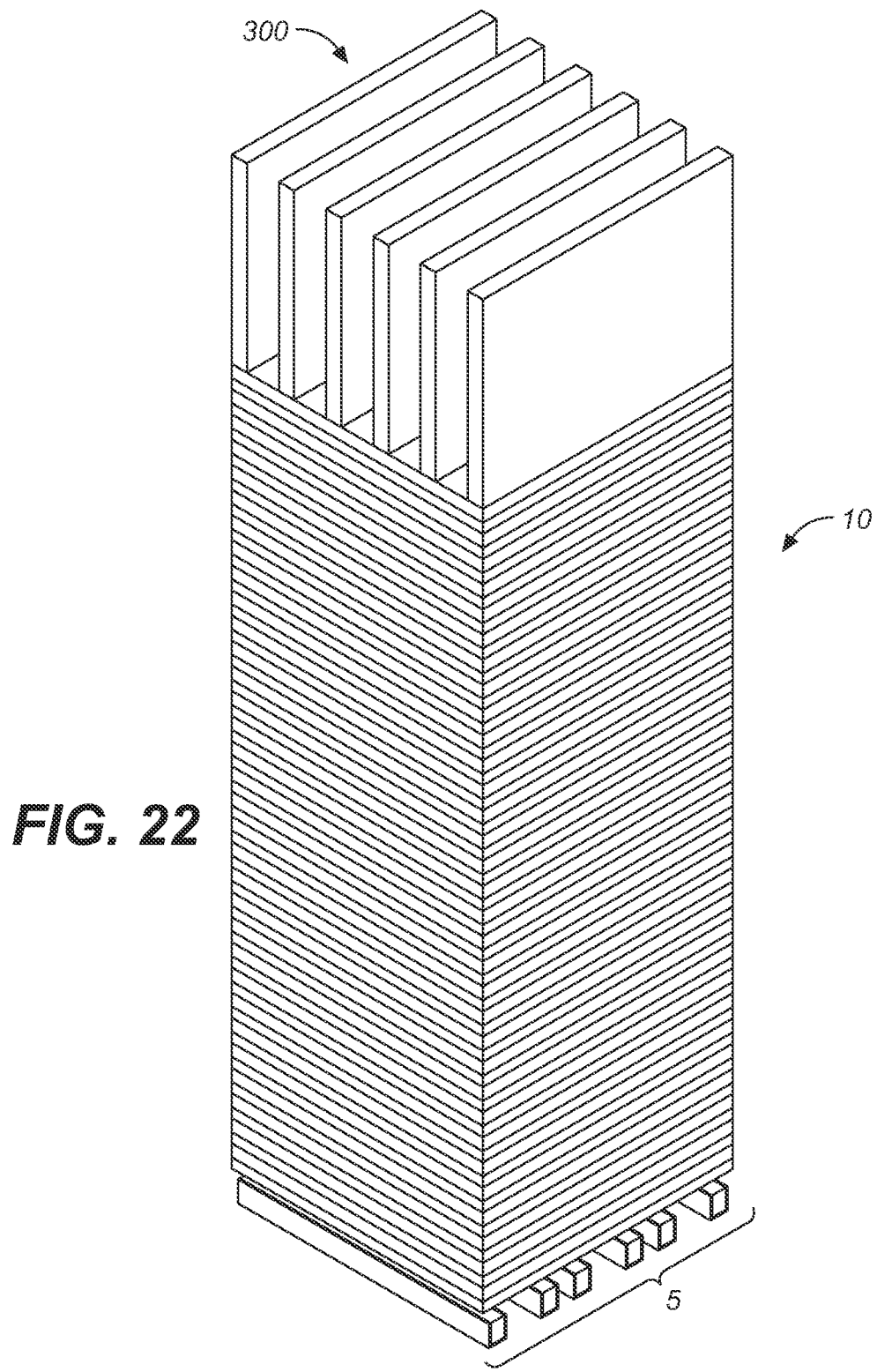

Memory structure 10 is then patterned to form word lines stacks 285 by creating trenches 280 with mechanical support from dielectric pillars 270, which are not substantially etched. The resulting structure is shown in FIG. 20. The dielectric pillars 270 provide mechanical support to the high aspect—ratio stacks 280 of word line strips. Sacrificial dielectric material material 290, which may be the same material as dielectric pillars 270, is deposited to fill trenches 280. Excess sacrificial dielectric material 290 may be removed from the top of word line stacks 285 using, for example, CMP or etchback. Thereafter, a masking layer (not shown) may be deposited and patterned, so as to allow sacrificial dielectric material 290 to be removed from every other ones of the filled trenches 280. Memory structure 10, after removal of the masking layer and sacrificial dielectric material 290 form every other ones of trenches 280, is shown in FIG. 22. The rest of the fabrication of memory structure 10 may proceed according to the description above and FIGS. 4-16.

Figure 23:
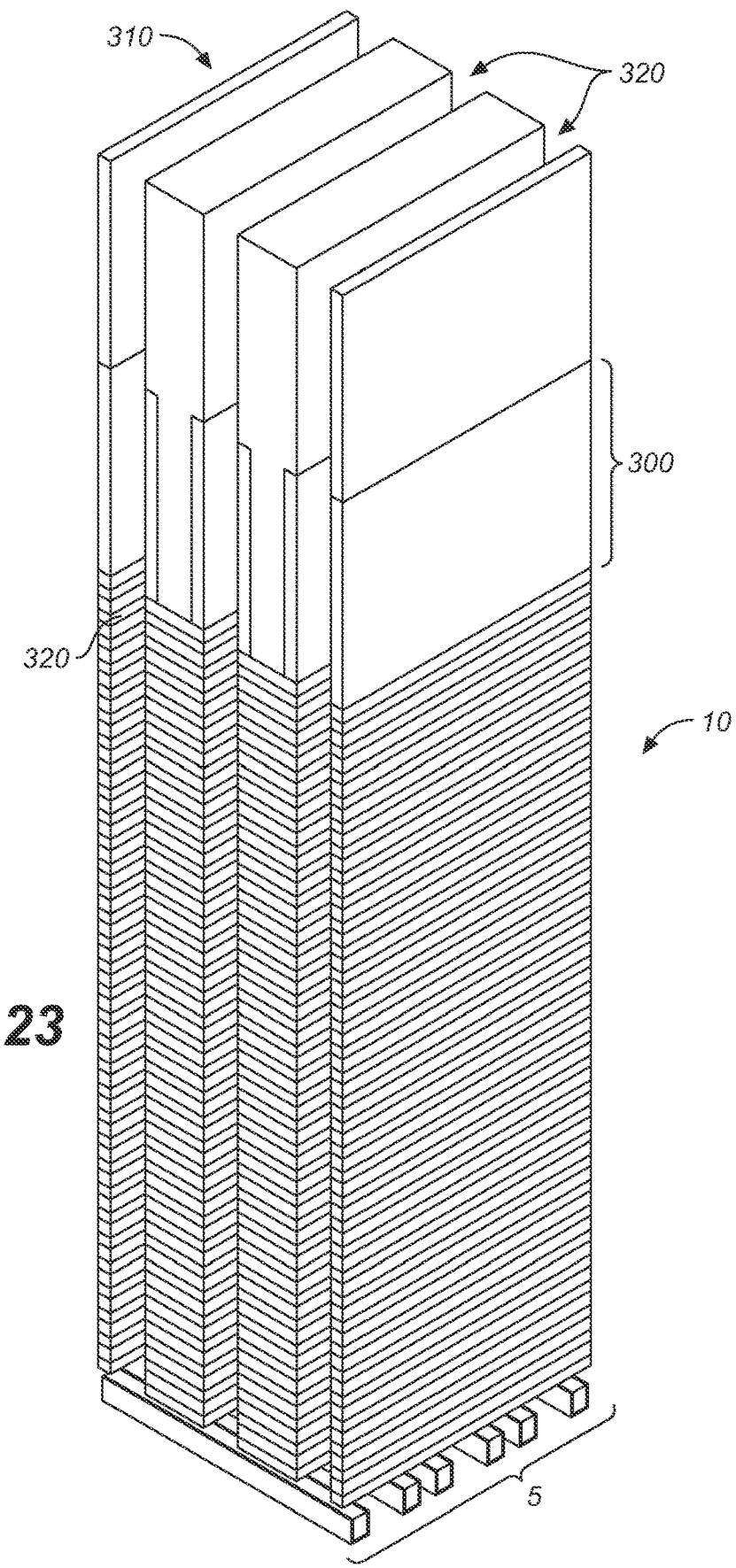

Yet another embodiment of the present invention uses stacked masks to form the word line strips. Referring to FIG. 22, first masking layer 300 is deposited and patterned. First masking layer 300 defines the final dimension and pitches of the word line stacks. After the first masking layer 300 is formed, second masking layers 310, shown in FIG. 23, is deposited and patterned. Second masking layer 310 has a larger pitch and dimension than first masking layer 300, and is provided on top of first masking layer 300. Second masking layer 310 defines every other final word stacks in memory structure 10, as shown in FIG. 23. FIG. 23 also shows trenches 320, which are etched through memory structure 10 after second masking layer 310 is defined.

Figure 24:
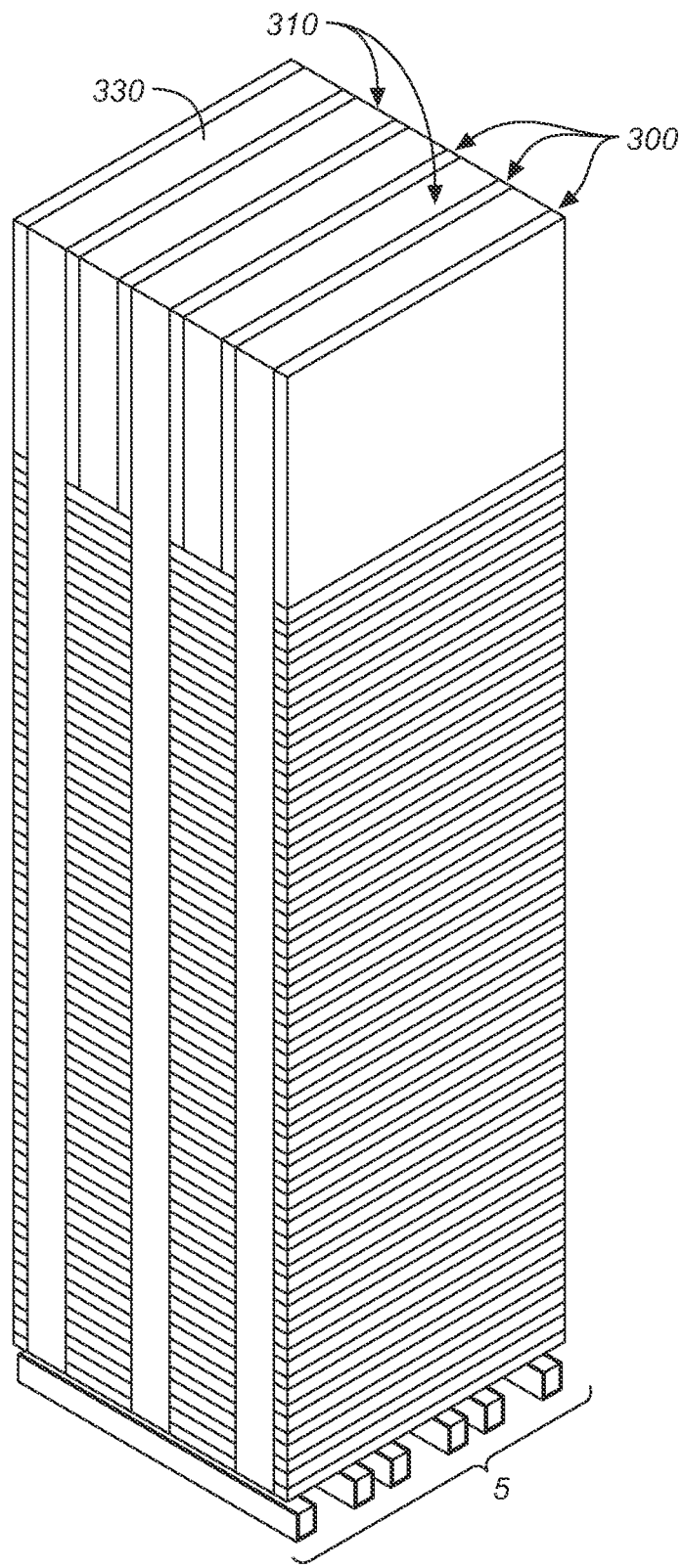

A planarization step (e.g., an etch-back step) removes remove a portion of second masking layer 310, such that the top of second masking layer 310 is flush with first masking layer 300. Sacrificial dielectric material 330 is then deposited to fill trenches 320, followed by removal of excess sacrificial dielectric material 330 from the top surfaces of first masking layer 300 and second masking layer 310, such as shown in FIG. 24.

Figure 25:
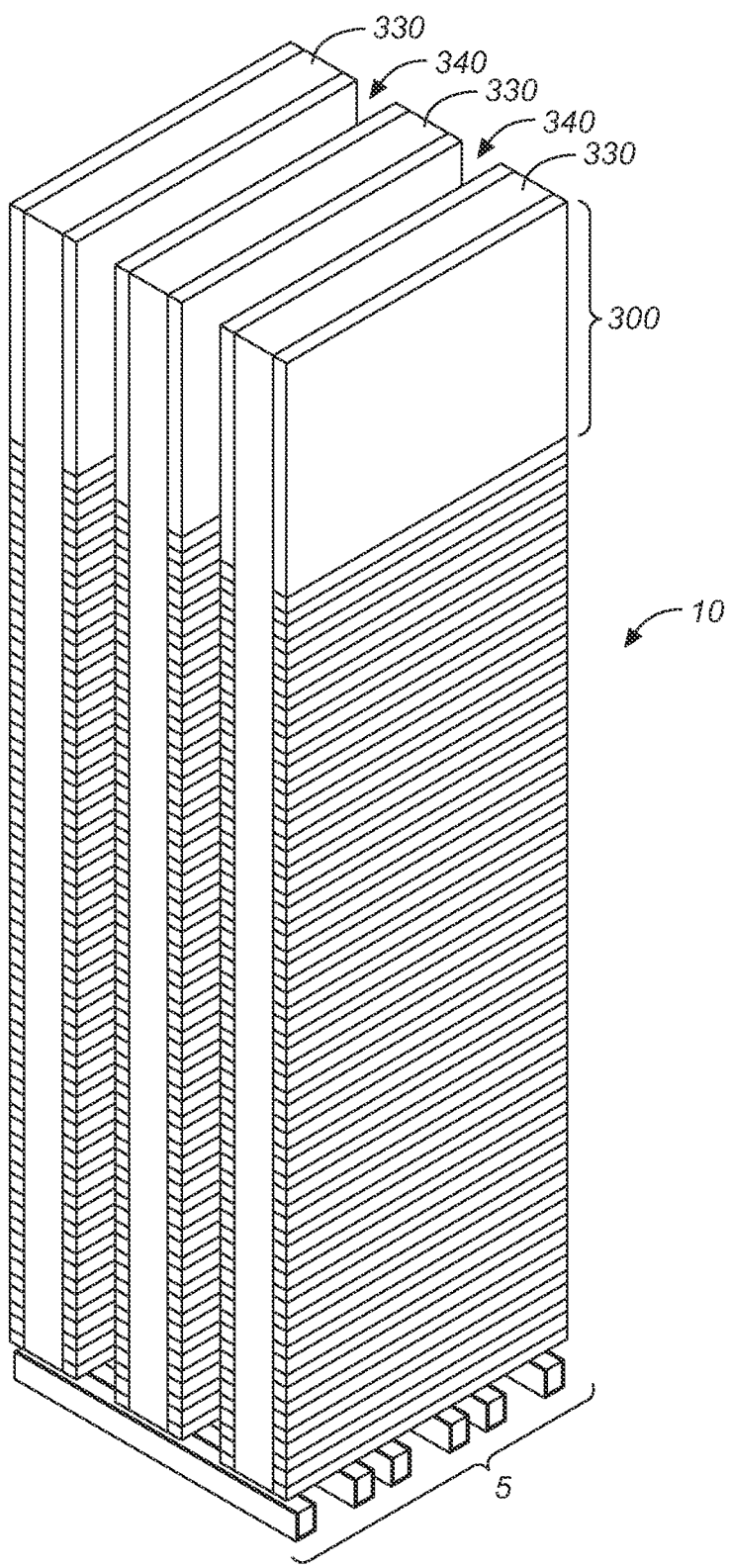
Figure 26:
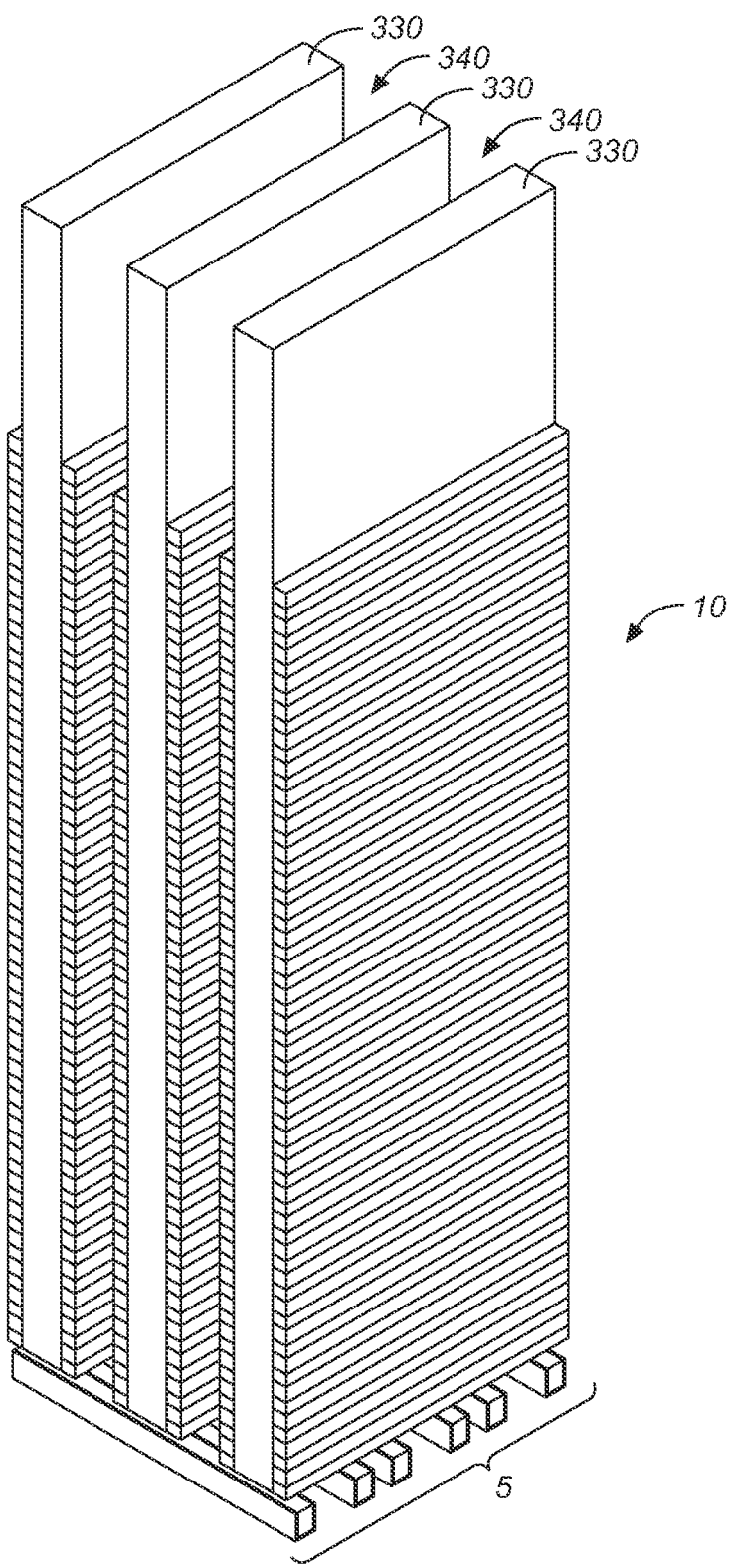

The remainder of second masking layer 310 is then removed by a selective etching technique. First masking layer 300 and sacrificial dielectric layer 330 are then used as masks to etch a second set of trenches 340, as shown in FIG. 25. Thereafter, the remainder of first masking layer 300 is then remove by a selective etching technique, as shown in FIG. 26.

Figure 27:
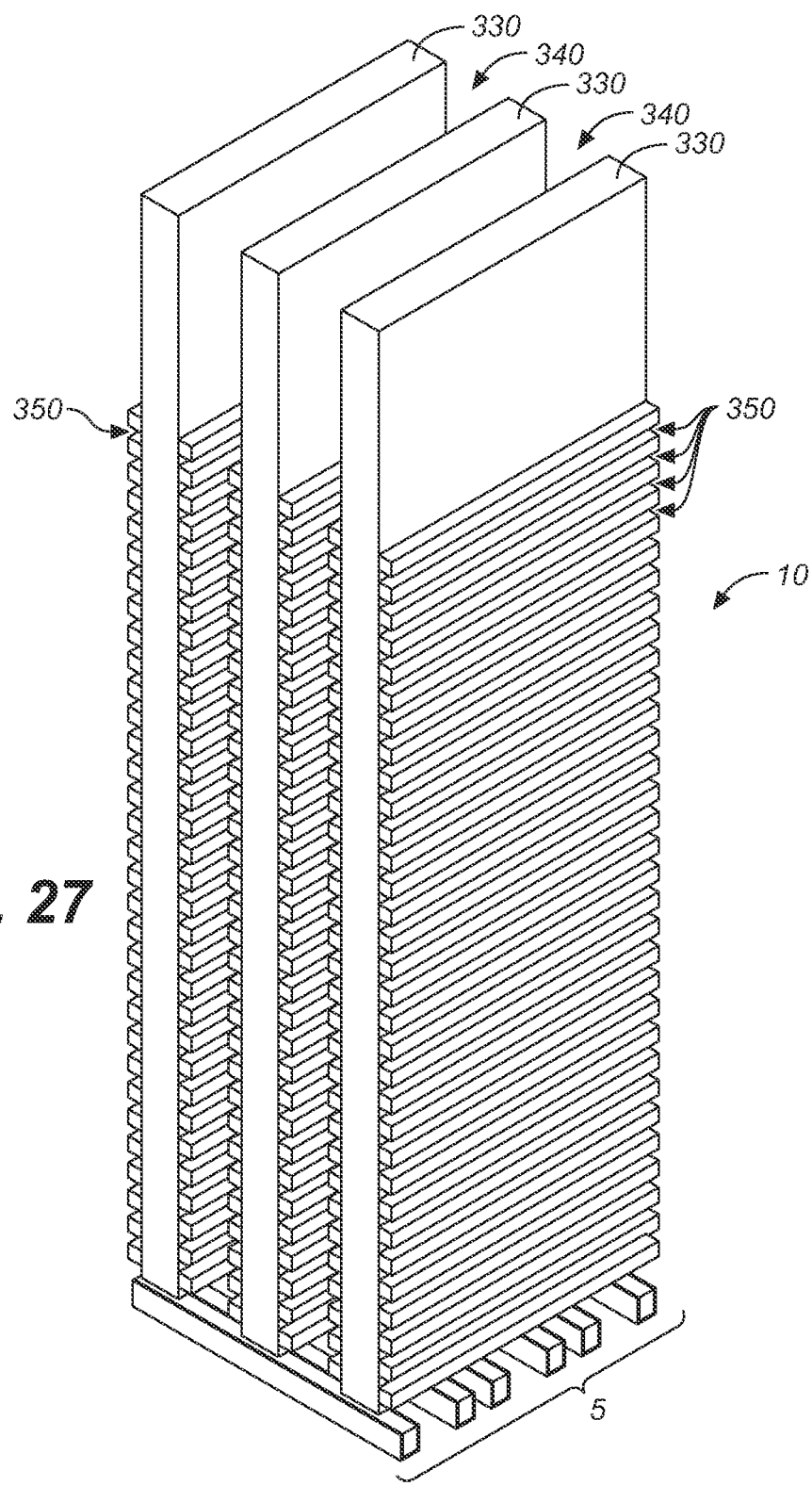
Figure 28:
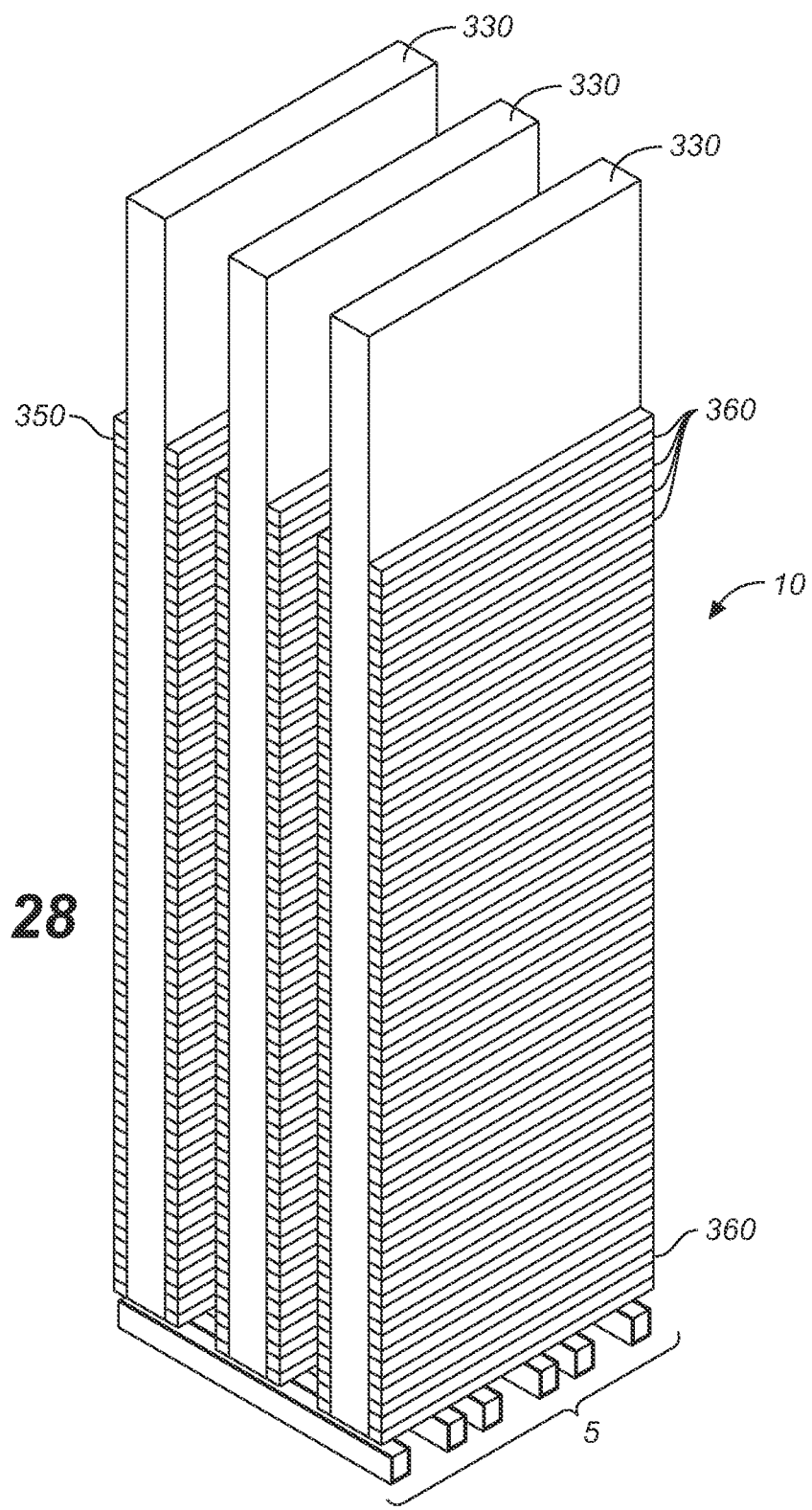
Figure 29:
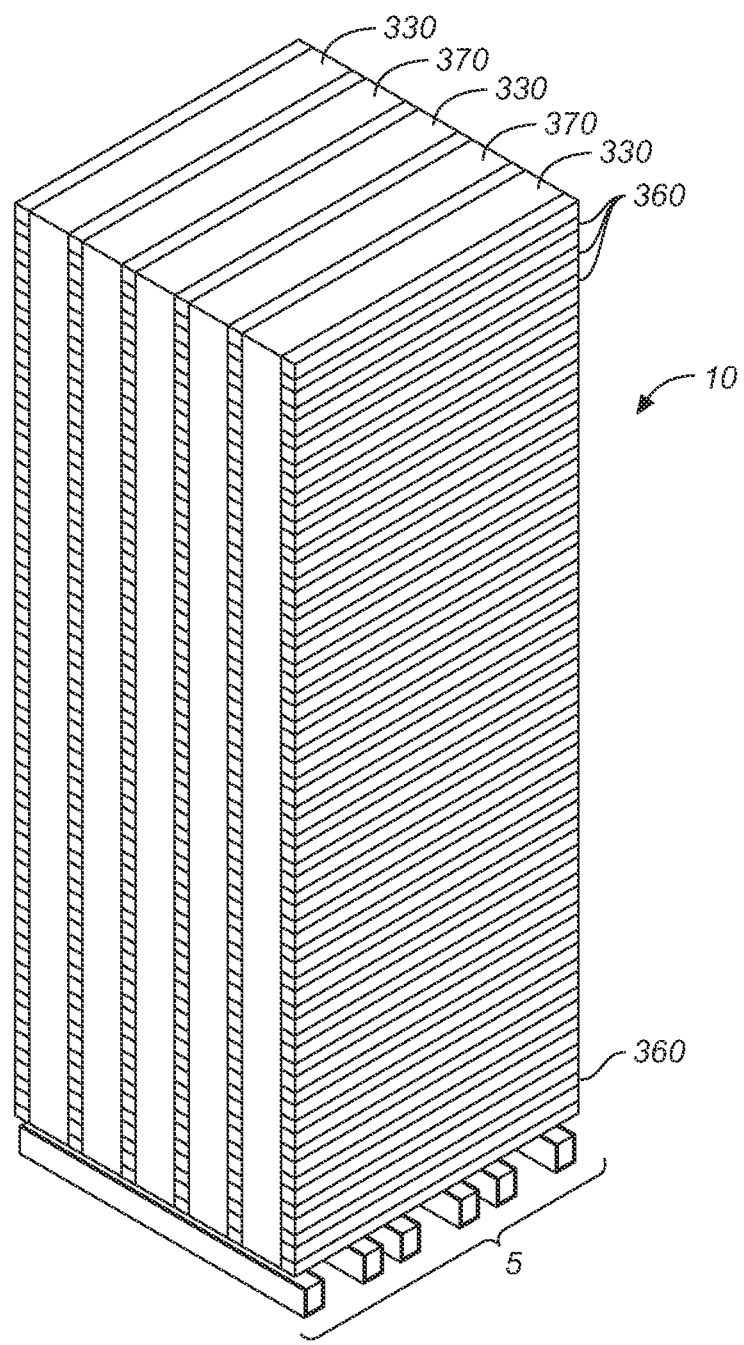

The silicon nitride layers (40) are then removed by a selective etching technique, leaving cavities 350, such as shown in FIG. 27. Metal layers 360 are then deposited to fill trenches 340 and cavities 350. Metal deposited on the sidewalls of trenches 340 and top surfaces of sacrificial dielectric material 330 are then removed by an isotropic etching technique, leaving metal 360 filling cavities 350, as shown in FIG. 28. The details of this metal replacement process have been detailed in description above in conjunction with FIGS. 4 and 5. Thereafter, sacrificial dielectric material 370 is deposited into trenches 340, followed by removal of any excess sacrificial dielectric material 370 from the top surfaces of memory structure 10. The rest of the fabrication of memory structure 10 may proceed according to the description above and FIGS. 8-16.

The above detailed description is provided to illustrate specific embodiments of the present invention and is not intended to be limiting. Numerous variations and modifications within the scope of the present invention are possible. The present invention is set forth in the accompanying claims.

We claim:

1. A method for high aspect ratio etching, comprising:
preparing above a surface of a semiconductor substrate a plurality of multi-layers, stacked one on top of another along a first direction substantially orthogonal to the surface of the semiconductor substrate, wherein each multi-layer comprising a first layer and a second layer, wherein the first layer comprises a first dielectric material and the second layer comprises a first material;
patterning and etching the multilayers along the first direction using a first mask to form a first set of trenches that divide the multi-layers into a first group of multi-layer stacks, wherein each of the first set of trenches extends along a second direction substantially parallel to the surface of the semiconductor substrate;
filling the first set of trenches with a second dielectric material;
patterning and etching the first group of multi-layer stacks along the first direction using a second mask to form a second set of trenches that create, out of the first group of multi-layer stacks, a second group of multi-layer stacks, wherein each of the second set of trenches extends along the second direction parallel the first set of trenches;
filling the second set of trenches with the second dielectric material; and
selectively etching a first portion of the second dielectric material in the first and second sets of trenches to provide a first plurality of shafts that extends along the first direction;
depositing a semiconductor layer of a first conductivity conformally; and
filling each shaft with a third dielectric material.

2. The method of claim 1, wherein etching the multi-layer and etching the first group of multi-layer stacks each involve an etch of an aspect ratio less than 40.

3. The method of claim 1, wherein the second mask comprises mask structures each overlapping at least two neighboring ones of the first group of multi-layer stacks and one of the first set of second dielectric material-filled trenches therebetween.

4. The method of claim 1, wherein the first material comprises a conductive material.

5. The method of claim 1, further comprising depositing a storage material conformally on the sidewalls of each shaft.

6. The method of claim 1, wherein the semiconductor layer of a first conductivity comprises one or more of: indium gallium zinc oxide (IGZO) and zinc oxide.

7. The method of claim 1, further comprising:
selectively etching a first via and a second via through the third dielectric material in each shaft; and
filling the first and second vias in each shaft with a semiconductor material of a second conductivity opposite the first conductivity or a conductive material.

8. The method of claim 7, further comprising, prior to filling each shaft with the third dielectric material, depositing a liner layer over the semiconductor layer of the first conductivity, and wherein the method further comprises, prior to filling the first and second vias in each shaft by the semiconductor material of the second conductivity, removing the liner layer to expose the semiconductor layer of the first conductivity.

9. The method of claim 7, further comprising, prior to preparing the multi-layers, providing a plurality of conductors above the surface of the semiconductor substrate, each conductor extending along a third direction substantially orthogonal to each of the first and second directions.

10. The method of claim 9, wherein the conductors are isolated from the multi-layers by an isolation layer, wherein etching the first and second vias in each shaft further comprises etching through the isolation layer to provide a conductive path between the semiconductor material of the second conductivity or the conductive material in selected ones of first and second vias and to be electrically connected to corresponding ones of the conductors.

11. The method of claim 7, further comprising providing a plurality of conductors above the second group of multi-layer stacks, each conductor extending along a third direction substantially orthogonal to each of the first and second directions.

12. The method of claim 11, further comprising providing conductive paths to enable the semiconductor material of the second conductivity or the conductive material in selected ones of the first and second vias to be electrically connected to one of the conductors.

13. The method of claim 11, further comprising: providing circuit elements in the semiconductor substrate; and electrically connecting the semiconductor material of the second conductivity or the conductive material in selected ones of the first and second vias to corresponding ones of the circuit elements, each of the circuit elements being situated substantially below its corresponding first and second vias.

14. The method of claim 13, further comprising providing an isolation layer between the circuit elements and the multi-layers, wherein electrically connecting selected ones of the semiconductor material of the second conductivity or the conductive material in the selected ones of the first and second vias to their corresponding circuit elements comprises creating conductive paths through the isolation layer.

15. The method of claim 7, the semiconductor material of the second conductivity or the conductive material partially fills the first and second vias, the method further comprising, thereafter, filling the first and second vias by a low resistivity conductor material.

16. The method of claim 5, further comprising:
selectively etching a second portion of the second dielectric material in the first and second sets of trenches to provide a second plurality of shafts that extends along the first direction;
depositing a storage material conformally in each of the second plurality of shafts;
depositing the semiconductor layer of the first conductivity conformally over the storage material in each of the second plurality of shafts; and
filling each of the second plurality of shafts with the third dielectric material.

17. The method of claim 16, wherein the storage material in the second plurality of shafts has different characteristics than those of the storage material in the first plurality of shafts.

18. The method of claim 1, the first material comprises a sacrificial layer, the method further comprising selectively replacing the sacrificial layer by a conductive material.

19. The method of claim 18, wherein replacing the sacrificial layer comprises selectively etching the sacrificial layer laterally through the second set of trenches up to the second dielectric material in the first set of trenches.

20. The method of claim 1, further comprising creating a staircase structure at one or more ends of each multi-layer stack, wherein each staircase structure has steps that successively extends the layers of the multi-layer stack along the second direction and wherein each step exposes a conductive layer in a multi-layer in the multi-layer stack.

21. The method of claim 20, further comprising providing an electrically insulating material over the staircase structure and providing via connections along the first direction to electrically connect to the conductive layer in each of the steps of the staircase structures.

* * * * *